United States Patent
Ho et al.

(10) Patent No.: US 12,087,616 B2
(45) Date of Patent: Sep. 10, 2024

(54) AIR GAP FORMATION METHOD

(71) Applicant: TAIWAN SEMICONDUCTOR MANUFACTURING COMPANY, LTD., Hsinchu (TW)

(72) Inventors: Chun-Chih Ho, Taichung (TW);
Yu-Chung Su, Hsinchu (TW);
Ching-Yu Chang, Yilang County (TW);
Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 129 days.

(21) Appl. No.: 17/720,789

(22) Filed: Apr. 14, 2022

(65) Prior Publication Data

US 2023/0238275 A1    Jul. 27, 2023

Related U.S. Application Data

(60) Provisional application No. 63/303,642, filed on Jan. 27, 2022.

(51) Int. Cl.
*H01L 21/762* (2006.01)
*H01L 21/768* (2006.01)

(52) U.S. Cl.
CPC .. *H01L 21/76289* (2013.01); *H01L 21/76813* (2013.01)

(58) Field of Classification Search
CPC ......... H01L 21/76289; H01L 21/76813; H01L 21/764; H01L 21/7682
See application file for complete search history.

(56) References Cited

U.S. PATENT DOCUMENTS

| | | | | |
|---|---|---|---|---|
| 5,461,003 A | * | 10/1995 | Havemann | H01L 21/02126 438/666 |
| 5,981,354 A | * | 11/1999 | Spikes | H01L 21/31053 438/782 |
| 8,962,400 B2 | | 2/2015 | Tsai et al. | |
| 9,093,514 B2 | | 7/2015 | Tsai et al. | |
| 9,236,267 B2 | | 1/2016 | De et al. | |
| 9,245,805 B2 | | 1/2016 | Yeh et al. | |
| 9,418,897 B1 | | 8/2016 | Ching et al. | |
| 9,520,482 B1 | | 12/2016 | Chang et al. | |
| 9,576,814 B2 | | 2/2017 | Wu et al. | |
| 9,608,116 B2 | | 3/2017 | Ching et al. | |
| 9,812,363 B1 | | 11/2017 | Liao et al. | |

(Continued)

*Primary Examiner* — Dale E Page
*Assistant Examiner* — Quovaunda Jefferson
(74) *Attorney, Agent, or Firm* — Birch, Stewart, Kolasch & Birch, LLP

(57) ABSTRACT

A method of forming a semiconductor device includes forming a plurality of non-insulator structures on a substrate, the plurality of non-insulator structures being spaced apart by trenches, forming a sacrificial layer overfilling the trenches, reflowing the sacrificial layer at an elevated temperature, wherein a top surface of the sacrificial layer after the reflowing is lower than a top surface of the sacrificial layer before the reflowing, etching back the sacrificial layer to lower the top surface of the sacrificial layer to fall below top surfaces of the plurality of non-insulator structures, forming a dielectric layer on the sacrificial layer, and removing the sacrificial layer to form air gaps below the dielectric layer.

20 Claims, 25 Drawing Sheets

(56) References Cited

U.S. PATENT DOCUMENTS 9,859,380 B2 1/2018 Lee et al.
2008/0260956 A1* 10/2008 Sakurai ............ H01L 21/02216
528/21

* cited by examiner

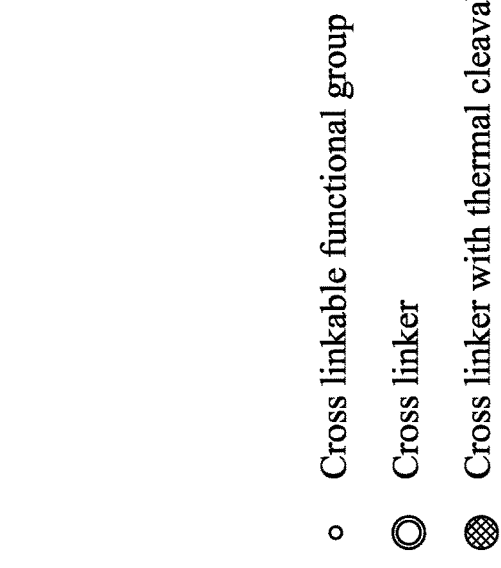
Fig. 11
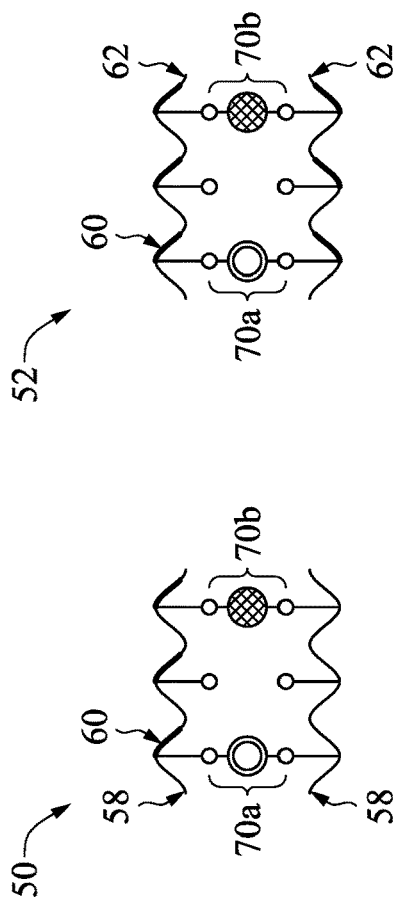
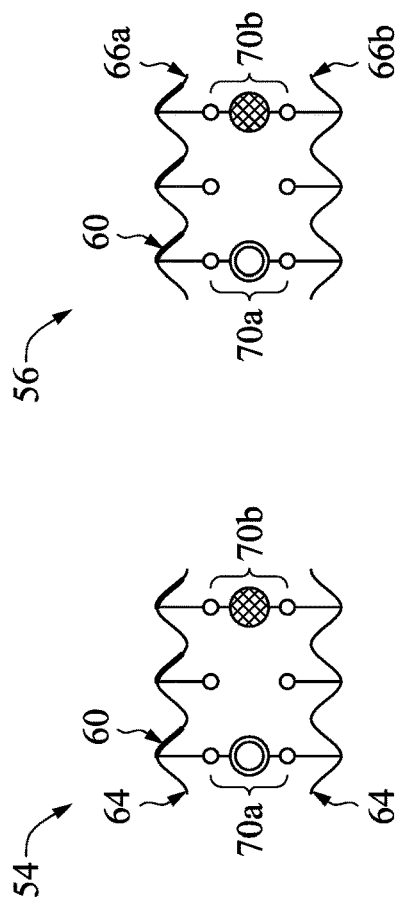
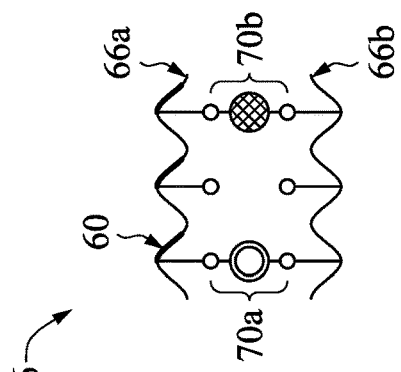

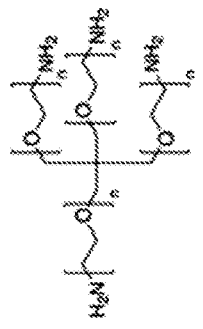
Poly(ethylene oxide)
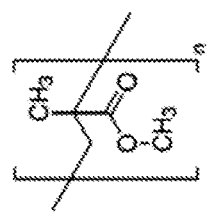
Poly(methyl methacrylate)
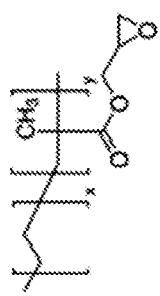
Poly(ethylene-co-glycidyl methacrylate)
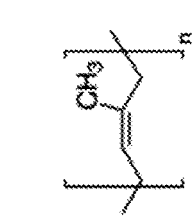
Polyisoprene
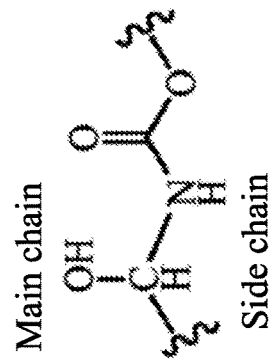
Main chain / Side chain
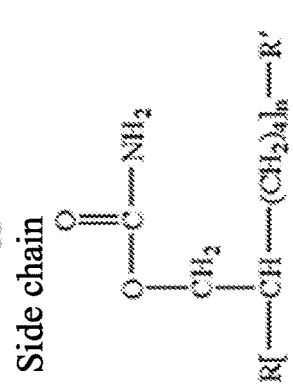
Poly(carbamate)
Poly(acetal ester)
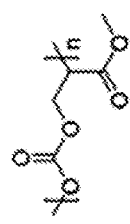
Poly(carbonate)
Fig. 12

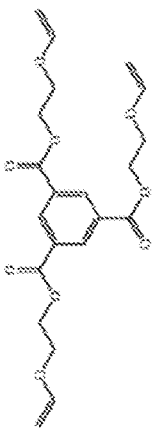
glycidyl ether
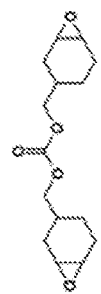
epoxide w/ carbonate
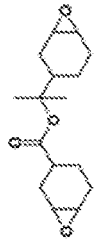
epoxide w/ ester
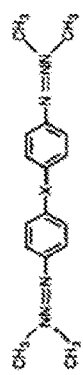
Triazene
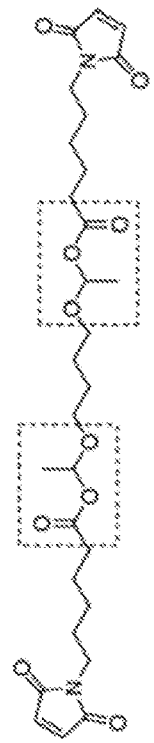
Maleimide w/ acetal ester
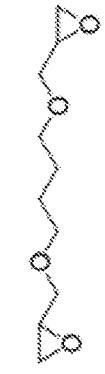
epoxide
epoxide w/ carbamate
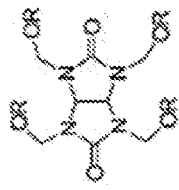
TMGU
Fig. 13

2-Phenoxyethanol
Dodecane
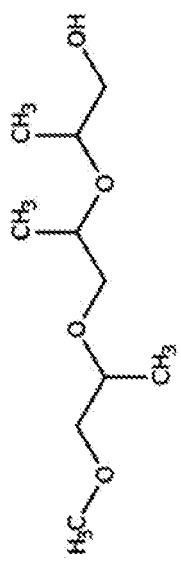
TPM
Heptyl ether
Fig. 14

AIR GAP FORMATION METHOD

PRIORITY CLAIM AND CROSS-REFERENCE

This application claims priority to U.S. Provisional Application Ser. No. 63/303,642, filed Jan. 27, 2022, which is herein incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative techniques of semiconductor dies.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIGS. 7-10 show chemical structures of the polymeric material in accordance with some embodiments.

FIG. 11 is the key to FIGS. 7-10.

FIG. 12 illustrates some examples of the oligomer and the polymer of the polymeric material according to some embodiments of the disclosure.

FIG. 13 illustrates some examples of the cross-linker according to some embodiments of the disclosure.

FIG. 14 illustrates some examples of the solvent according to some embodiments of the disclosure.

DETAILED DESCRIPTION

Figure 1:
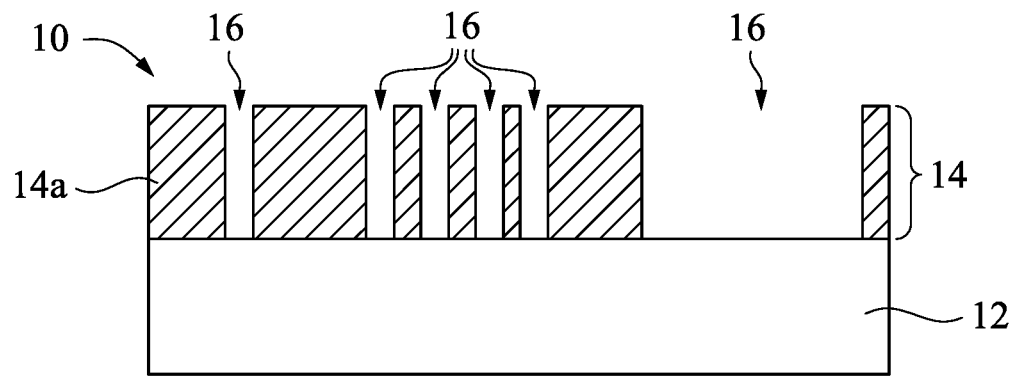
FIGS. 1-6 are cross-sectional views of a semiconductor device at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

As the size of integrated chip components continues to shrink, the parasitic capacitance through a dielectric layer filled between two adjacent conductive features has become an increasing contributor to the total parasitic capacitance of an integrated chip, which may have an impact on the overall performance thereof. In order to reduce the parasitic capacitance, the dielectric layer may be a low-k dielectric material of a dielectric constant approximately equal to or lower than 3.9. Furthermore, air gaps may be formed in the integrated chip to further reduce parasitic capacitance so as to improve the overall performance characteristics of the integrated chip. The air gaps may be formed by, for example, forming a sacrificial layer over substrate and a dielectric layer over the sacrificial layer, followed by removing the sacrificial layer to leave air gaps below the dielectric layer. However, if the sacrificial layer is formed of CVD, it may suffer from poor flatness in its top surface because of topography of underlying structures (e.g., fins protruding from substrate); if the sacrificial layer is formed of a spin-on process, it may also suffer from poor flatness in its top surface due to low fluidity. Such uneven top surface in the sacrificial layer may lead to non-uniformity in height of the subsequently formed air gaps. Therefore, embodiments of this disclosure provide improved flatness in the top surface of the sacrificial layer, thereby improving uniformity in the height of the air gaps.

FIGS. 1-6 are cross-sectional views of a semiconductor device 10 at various intermediate stages of manufacture according to various embodiments of the present disclosure. The semiconductor device 10 includes a substrate 12. The substrate 12 may be a semiconductor substrate, such as a bulk semiconductor, a semiconductor-on-insulator (SOI) substrate, or the like, which may be doped (e.g., with a p-type or an n-type dopant) or undoped. The substrate 12 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 12 may include silicon; germanium; a compound semiconductor including silicon carbide, gallium arsenide, gallium phosphide, indium phosphide, indium arsenide, and/or indium antimonide, an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

As shown in FIG. 1, there may be a non-insulator pattern 14 formed on the substrate 12. The non-insulator pattern 14 includes a plurality of non-insulation structures 14a separated from each other by trenches 16. In some embodiments, the substrate 12 and the non-insulator pattern 14 are part of a metallization layer over the substrate (not shown). It should be recognized that while FIG. 1 illustrate the non-insulator 14 has seven non-insulation structures 14a, the non-insulator pattern 14 may include any number of non-insulators. The non-insulator pattern 14 may be formed of suitable metal materials such as copper, cooper alloys, aluminum, silver, tungsten, gold, any combinations thereof and/or the like. In some embodiments, the non-insulator pattern 14 includes a plurality of fins. Stated differently, the non-insulator structures 14a may be semiconductor fins extending from the substrate 12.

Figure 2:
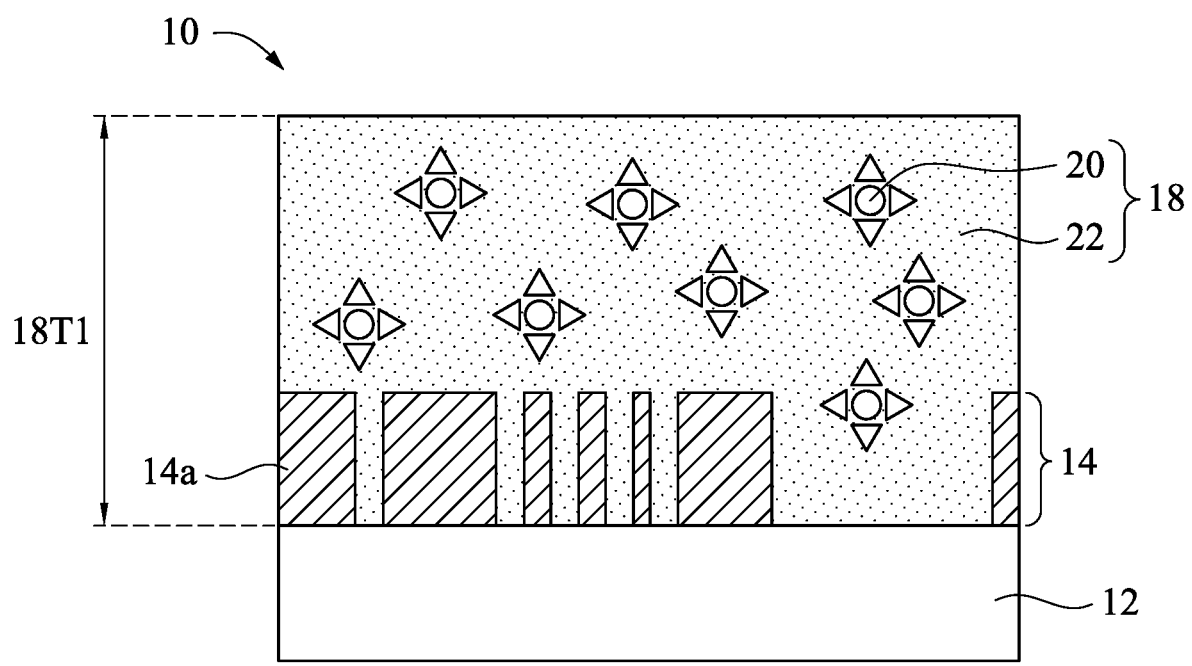
Figure 3:
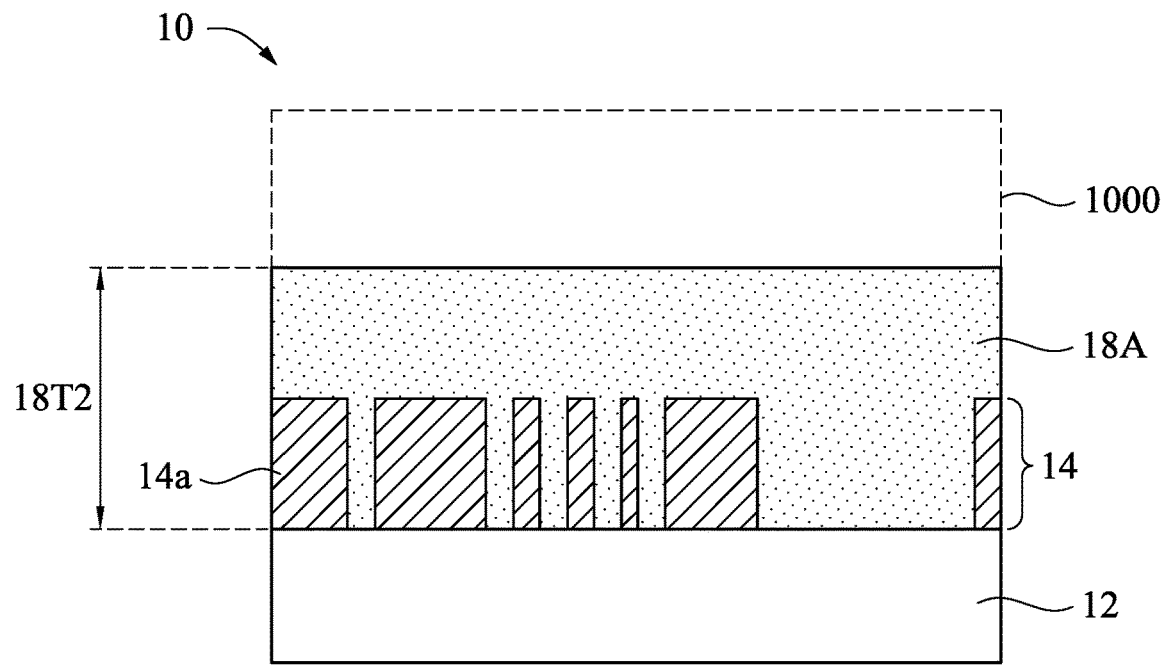

Reference is made to FIG. 2. A sacrificial layer 18 is formed over the non-insulator pattern 14. More particularly, the sacrificial layer 18 is flowable and fills the trenches 16 shown in FIG. 1 and over a top of the non-insulator pattern 14. The sacrificial layer 18 can be formed using a spin-on process (or spin coating process) and thus is also called a spin-on carbon material layer. The sacrificial layer 18 is made of a solvent 20 and a polymeric material 22 as a solute, which contains a number of repeating units, dissolved in the solvent 20. Since the solvent has a fluidity higher than a fluidity of the polymeric material 22. By including the solvent 20 in the sacrificial layer 18, a fluidity of the sacrificial layer 18 can be increased and a thickness thereof is increased as well. As a result, the sacrificial layer 18 can have high degree of flatness in its top surface, which is helpful for increasing a flatness in a top surface of the sacrificial layer 18 after a subsequent etch back process, and thus achieving increased uniformity in height of the subsequently formed air gaps 26 (see FIG. 6) and will be discussed in greater detail below.

The polymeric material 22 of the sacrificial layer 18 may be a thermal cleavable polymer, oligomer, co-polymer, oligomer/polymer hybrid, and/or a combination thereof, and a thermal cleavable cross-linker. FIGS. 7-10 show chemical structures 50, 52, 54 and 56 of the polymeric material 22 in accordance with some embodiments, where FIG. 11 is the key to FIGS. 7-10. Suitable thermal cleavable polymer, oligomer, co-polymer, oligomer/polymer hybrid for the polymeric material 22 may include a thermal cleavable functional group on a main chain (or backbone) or a side chain. The thermal cleavable functional group provides the sacrificial layer 18 (see FIG. 2) a bond cleavage function when being heated at an elevated temperature (e.g. above its decomposable temperature). For example, the sacrificial layer 18 can be decomposed by thermal pyrolysis. As shown in FIGS. 7, 9 and 10, the thermal cleavable groups are embedded in the main chain, in some embodiments. In another embodiment, the thermal cleavable groups are embedded in the side chain, as shown in FIG. 8.

Reference is made to FIG. 7. The chemical structure 50 includes polymers 58, a first cross-linker 70a and a second cross-linker 70b with thermal cleavable group, which are used to cross-link the polymers 58. Each of the polymers 58 may have a molecular weight of greater than 5000.

Reference is made to FIG. 8. The chemical structure 52 includes copolymers 62, a first cross-linker 70a and a second cross-linker 70b with thermal cleavable group, which are used to cross-link the copolymers 62.

Reference is made to FIG. 9. The chemical structure 54 includes oligomers 64, a first cross-linker 70a and a second cross-linker 70b with thermal cleavable group, which are used to cross-link the oligomers 64.

Reference is made to FIG. 10. The chemical structure 56 includes oligomer/polymer hybrids, for example, a hybrid of polymer 66a and oligomer 66b, a first cross-linker 70a and a second cross-linker 70b with thermal cleavable group, which are used to cross-link the oligomer/polymer hybrid (e.g., the polymer 66a and the oligomer 66b).

In FIGS. 7-10, the first cross-linker 70a and the second cross-linker have different compositions. For example, the first cross-linker 70a in the chemical structures 50, 52, 54 and 56 has no thermal cleavable group while the second cross-linker 70b has a thermal cleavable group embedded therein. By including the thermal cleavable group in the second cross-linker 70b, a higher thermal degradable efficiency (e.g., in a subsequent thermal pyrolysis process) of the chemical structures 50, 52, 54 and 56 can be achieved.

The polymeric material 22 of the sacrificial layer 18 (see FIG. 2) may have selected composition to tune a glass transition temperature ($T_g$), a melting temperature ($T_m$) and a decomposable temperature ($T_d$). In some embodiments, the oligomer, polymer, copolymer and oligomer/polymer hybrid in the chemical structures 50, 52, 54 and 56 may include ester, carbamate, carbonate, acetal ester, or the like. In some cases for the mechanical strength requirement, the first cross-linker 70a and the second cross-linker 70b applied for the crosslinking of the polymer, oligomer, copolymer and oligomer/polymer hybrid, may be glycidyl ether, alkyl oxide, alkene, alkyne, triazene or other cross-linkable functional group.

In some embodiments, the polymeric material 22 of the sacrificial layer 18 (see FIG. 2) has a glass transition temperature of lower than 200° C., a melting temperature of lower than 300° C., and a decomposable temperature of lower than 400° C. The polymeric material 22 with the disclosed range may provide sufficient property for the purpose of reflow process, etching back and thermal pyrolysis.

FIG. 12 illustrates some examples of the oligomer and the polymer of the polymeric material 22 according to some embodiments of the disclosure. In some embodiments, the polymeric material 22 may be polyisoprene, poly(ethylene-co-glycidyl methacrylate), poly(methyl methacrylate), poly(ethylene oxide), poly(carbamate), poly(carbonate), poly(acetal ester), copolymer thereof or a hybrid thereof. In FIG. 12, the poly(carbamate) may have a main chain and a side chain having the chemical structures as illustrated. FIG. 13 illustrates some examples of the cross-linker according to some embodiments of the disclosure. In some embodiments, the cross-linker may be any suitable cross-linker, such as tetramethoxymethyl glycol urea (TMGU), epoxide, triazene, glycidyl ether, maleimide with acetal ester, epoxide with carbonate, epoxide with carbamate, epoxide with ester, or a combination thereof. The cross-linker reacts with a functional group on one of the main chain of the polymeric material 22 and a functional group on another one of the main chain of the polymeric material 22 in order to cross-link and bond the two main chains together. This bonding and cross-linking increase the molecular weight of the organic component and increase the overall density of the organic component.

As discussed above, the solvent 20 of the sacrificial layer 18 is advantageous to increase the fluidity of the sacrificial layer 18 so as to improve flatness in the top surface of the sacrificial layer 18. Therefore, the sacrificial layer 18 may exhibit a high degree of flatness in its top surface. In some cases, the solvent 20 has a high boiling temperature. In some embodiments, the solvent 20 has a boiling temperature of about 120° C. to about 400° C., such as about 180° C. to about 350° C., which is high enough so as to maintain its liquid state during depositing the sacrificial layer 18. In other words, the solvent 20 having the boiling temperature with the above desired range would not evaporate during depositing the sacrificial layer 18. In some embodiments, the solvent 20 has a vapor pressure of 0.001 mmHg to 2 mm Hg at room temperature. FIG. 14 illustrates some examples of the solvent 20 according to some embodiments of the disclosure. In some embodiments, the solvent 20 may be Tripropylene glycol monomethyl ether (TPM), 2-Phenoxyethanol, Heptyl ether, Dodecane, or a combination thereof.

Referring back to FIG. 3, a baking process is performed to the semiconductor device 10 to reflow the sacrificial layer 18. By performing the baking process, the solvent 20 is evaporated. An amount of the evaporated solvent 20 is illustrated by a dashed line 1000. In some embodiments, the baking process may be performed at a temperature of 40° C. to 220° C. As a result, the sacrificial layer 18A has a reduced thickness. For example, the sacrificial layer 18A has a thickness 18T2 less than a thickness 18T1 of the sacrificial layer 18 in FIG. 2.

Figure 4:
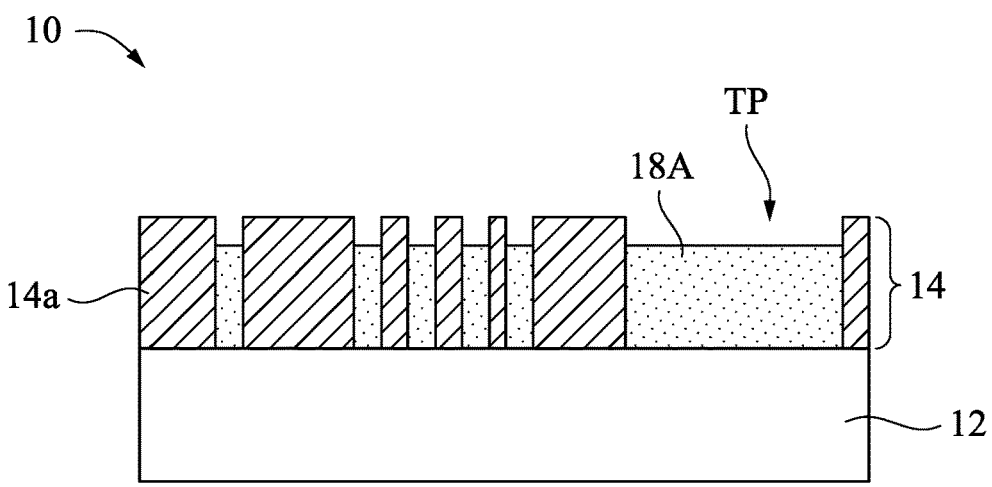

The sacrificial layer 18A is then etched back, as shown in FIG. 4. Due to the improvement of flatness in the top surface of the sacrificial layer 318A, the etched back sacrificial layer 18A has a high degree of flatness as well. Since a subsequently formed air gap (see FIG. 6) has a height substantially equal to a thickness of the etched back sacrificial layer 18A, by controlling an etch amount of the sacrificial layer 18A, the air gap with a desired height can be obtained. For example, by etching a greater amount of the sacrificial layer 18A, the air gap (see FIG. 6) may have reduced height. In some embodiments, after etching back the sacrificial layer 18A, a top of the non-insulator 14 is exposed. Two of each of the adjacent non-insulation structures 14a may be separated by a top spacing TP laterally.

Figure 5:
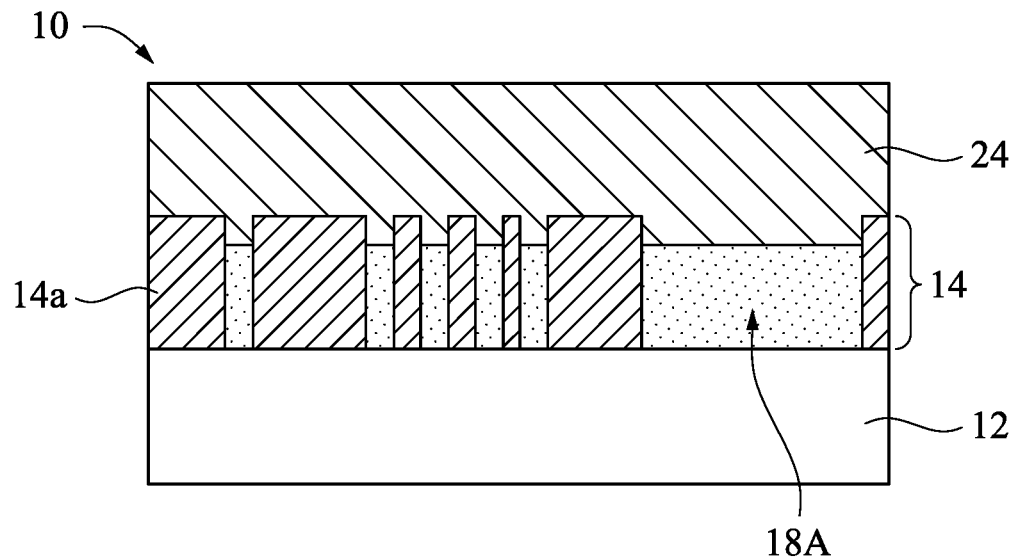

A dielectric layer 24 is formed on the sacrificial layer and fills into the top spacing TP between two adjacent non-insulation structures 14a of the non-insulator 14, as shown in FIG. 5. Due to the sacrificial layer 18A having a high degree of flatness in its top surface, the dielectric layer 24 has a bottom surface with a high degree of flatness as well. The dielectric layer 24 can be, for example, silicon dioxide layer, silicon carbide layer, silicon nitride layer, silicon oxycarbide layer, silicon oxynitride layer, low-k dielectric (e.g., having a dielectric constant of less than about 3.9) layer, extreme low-k (ELK) dielectric (e.g., having a dielectric constant of less than about 2.5) layer, the like, or combinations thereof.

Figure 6:
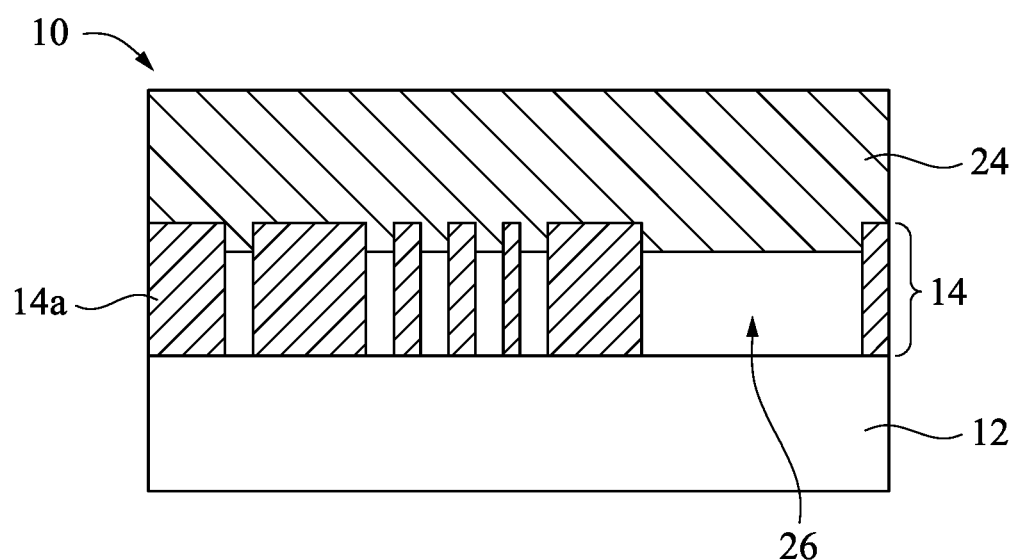

Reference is made to FIG. 6. The sacrificial layer 18A is then removed to form a plurality of air gaps 26 between the substrate 12 and the dielectric layer 24 in a vertical direction. In other words, the substrate 12 and the dielectric layer 24 are separated from each other by the air gaps 26. The neighboring non-insulators 14a are separated by the air gaps 26. Due to the bottom surface of the dielectric layer 24 having a high degree of flatness, the bottom surface of the dielectric layer 24 and a top surface of the substrate 12 are separated by a substantially equal distance. In other words, the air gaps 26 have a uniform height. That is, the air gaps 26 have substantially equal heights. As a result, the air gaps 26 can reduce the capacitance coupling between two adjacent non-insulation structures 14a uniformly.

In some embodiments, the sacrificial layer 18A is removed by a thermal process, for example, thermal pyrolysis, at a temperature greater than the decomposable temperature of the sacrificial layer 18A. By performing the thermal pyrolysis, the thermal cleavable functional groups in the polymeric material 22 and the cross-linker (e.g., the second cross-linker 70b) in the sacrificial layer 18A are cleaved, which yields pyrolysis products in gas phase such as $CO/CO_2$ and other gases. The gas-phase pyrolysis products are then rapidly removed using a vacuum or an inert gas, which in turn forms air gaps 26 below the dielectric layer 24. Suitable inert gases include but are not limited to argon, neon, helium, krypton, xenon, radon, nitrogen, and steam, or combinations thereof. By forming the air gaps 26, the capacitance coupling between two adjacent non-insulation structures 14a can be reduced so as to improve the overall performance characteristics of the semiconductor device 10.

Figure 15:
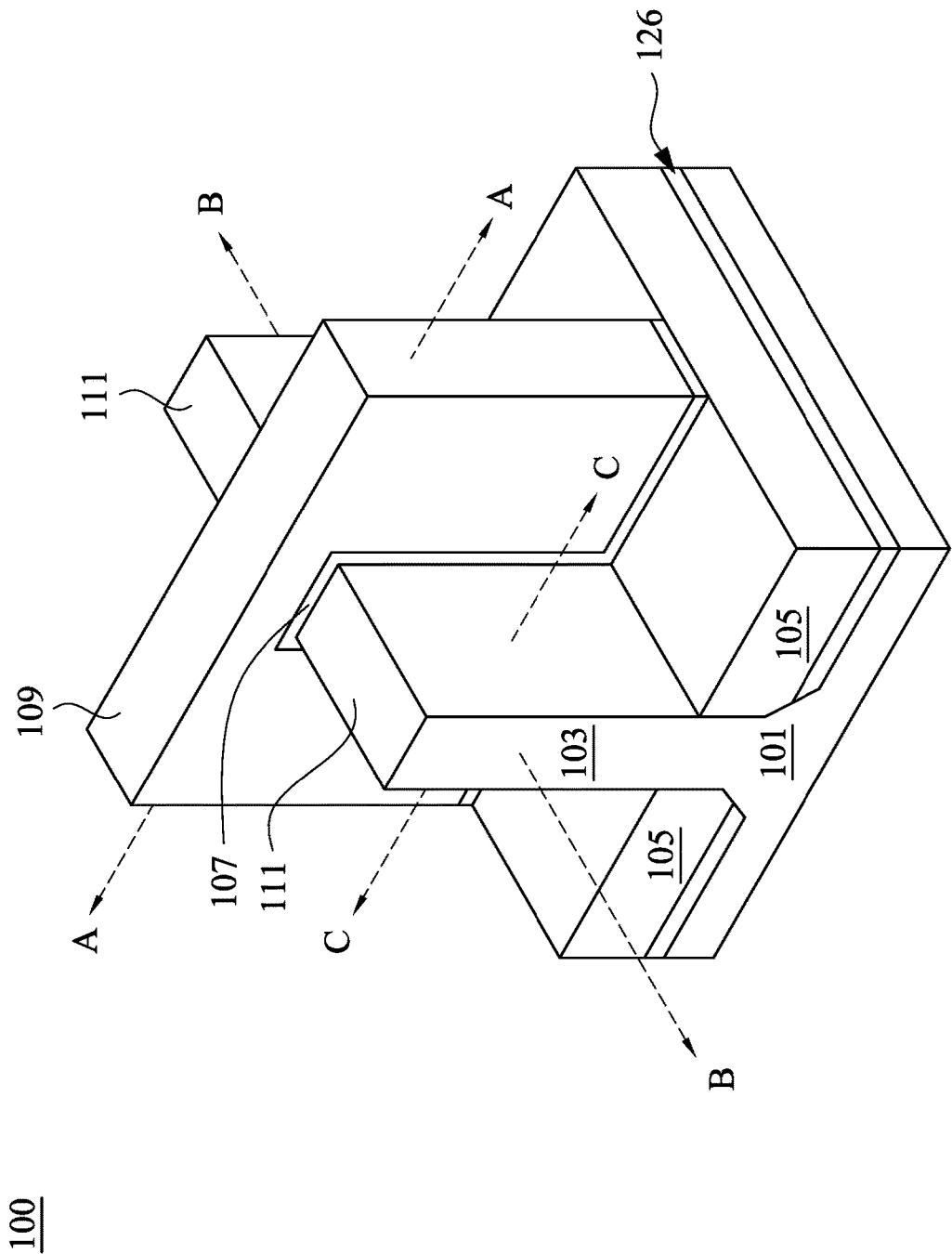
FIG. 15 illustrates an example of a fin field-effect transistor (FinFET) in a three-dimensional view, in accordance with some embodiments.
Figure 16:
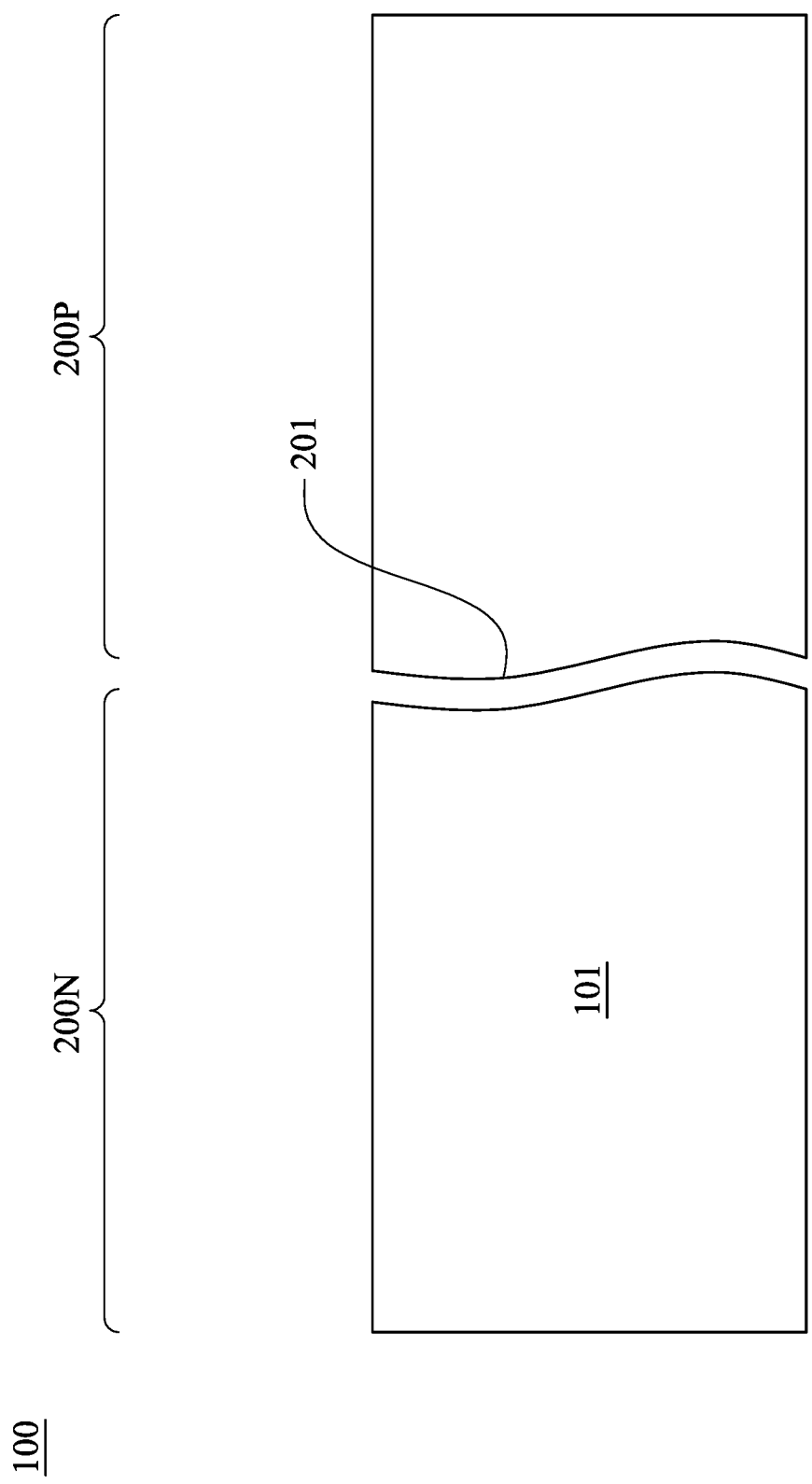
FIGS. 16-25, 26A, 26B, 27A, 27B, 28A, 28B, 29A, 29B, 30A, 30B, 31A, 31B, 32A and 32B are cross-sectional views of intermediate stages in the manufacturing of FinFETs, in accordance with some embodiments.

The forgoing concept about forming air gaps below a dielectric flow is applicable to various processes in IC fabrication. For example, this concept may be applicable to shallow trench isolation (STI) formation in fin field-effect transistors (FinFETs), as described in greater detail below. FIG. 15 illustrates an example of a fin field-effect transistor (FinFET) 100 in a three-dimensional view, in accordance with some embodiments. The FinFET 100 includes a fin 103 on a substrate 101 (e.g., a semiconductor substrate). Shallow Trench Isolation (STI) regions 105 are disposed on the substrate 101 in which air gaps 126 are present between the substrate 101 and the STI regions 105. The fin 103 protrudes above and from between neighboring STI regions 105 and the neighboring air gaps 104. Although the STI regions 105 are described/illustrated as being separate from the substrate 101, as used herein the term "substrate" may be used to refer to just the semiconductor substrate or a semiconductor substrate inclusive of isolation regions. Additionally, although the fin 103 is illustrated as a single, continuous material as the substrate 101, the fin 103 and/or the substrate 101 may comprise a single material or a plurality of materials. In this context, the fin 103 refers to the portion extending between the neighboring STI regions 105 and the neighboring air gaps 126.

A gate dielectric layer 107 is along sidewalls and over a top surface of the fin 103, and a gate electrode 109 is over the gate dielectric layer 107. Source/drain regions 111 are disposed in opposite sides of the fin 103 with respect to the gate dielectric layer 107 and the gate electrode 109. FIG. 15 further illustrates reference cross-sections that are used in later figures. Cross-section A-A is along a longitudinal axis of the gate electrode 109 and in a direction, for example, perpendicular to the direction of current flow between the source/drain regions 111 of the FinFET 100. Cross-section B-B is perpendicular to cross-section A-A and is along a longitudinal axis of the fin 103 and in a direction of, for example, a current flow between the source/drain regions 111 of the FinFET 100. Subsequent figures refer to these reference cross-sections for clarity.

Additionally, while some embodiments discussed herein are discussed in the context of FinFETs formed using a gate-last process, this is intended to merely be illustrative and is not intended to be limiting. For example, in other embodiments, a gate-first process may be used. Also, some embodiments contemplate aspects used in planar devices, such as planar FETs, nanostructure (e.g., nanosheet, nanowire, gate-all-around, or the like) field effect transistors (NS-FETs), or the like.

FIGS. 16 through 31B are cross-sectional views of intermediate stages in the manufacturing of FinFETs, in accordance with some embodiments. FIGS. 16 through 25 illustrate reference cross-section A-A illustrated in FIG. 15, except for multiple fins/FinFETs. FIGS. 26A, 27A, 28A, 29A, 30A, 31A and 32A are illustrated along reference cross-section A-A illustrated in FIG. 15, and FIGS. 26B, 27B, 28B, 29B, 30B, 31B and 32B are illustrated along a similar cross-section B-B illustrated in FIG. 15, except for multiple fins/FinFETs.

In FIG. 15, a substrate 101 is provided. The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 101 has an n-type region 200N and a p-type region 200P. The n-type region 200N can be for forming n-type devices, such as N-type metal-oxide semiconductor (NMOS) transistors, e.g., n-type FinFETs. The p-type region 200P can be for forming p-type devices, such as P-type metal-oxide semiconductor (PMOS) transistors, e.g., p-type FinFETs. The n-type region 200N may be physically separated from the p-type region 200P (as illustrated by divider 201), and any number of device features (e.g., other active devices, doped regions, isolation structures, etc.) may be disposed between the n-type region 200N and the p-type region 200P.

Figure 17:
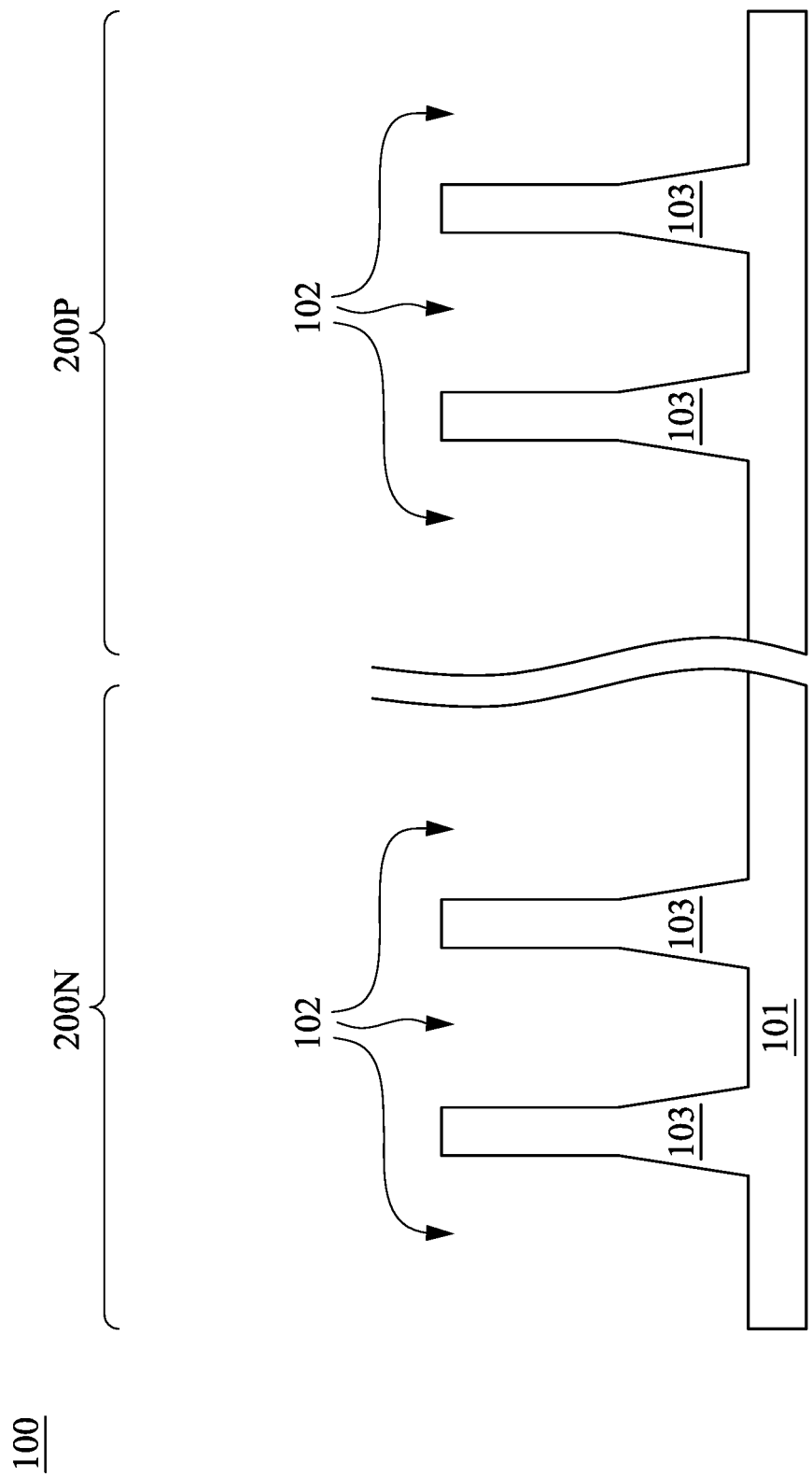

In FIG. 17 fins 103 are formed in the substrate 101. The fins 103 are semiconductor strips. In some embodiments, the fins 103 may be formed in the substrate 101 by etching trenches 102 in the substrate 101. The etching may be any acceptable etch process, such as a reactive ion etch (RIE), neutral beam etch (NBE), the like, or a combination thereof. The etch may be anisotropic.

The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 103.

Figure 18:
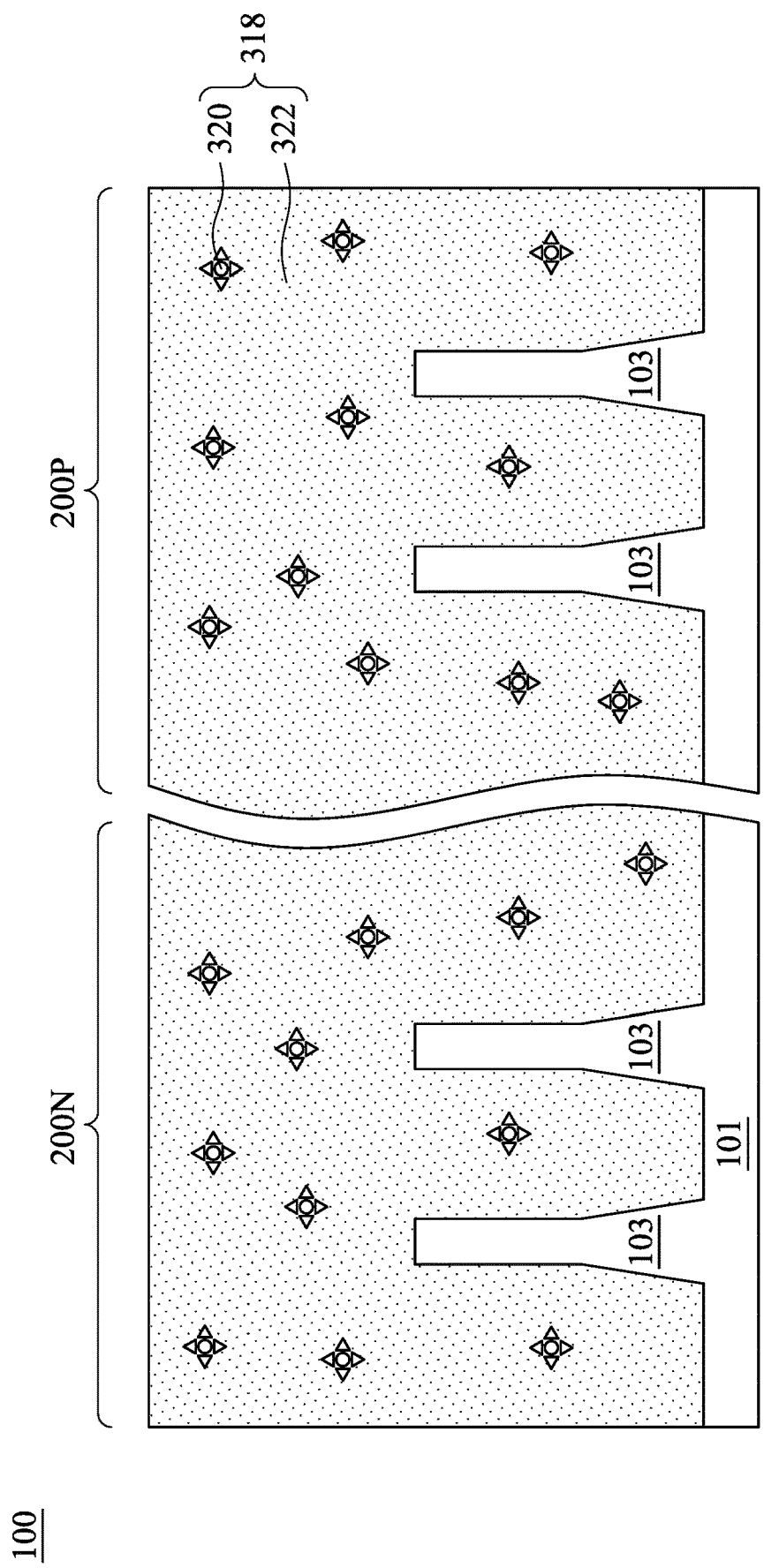

Reference is made to FIG. 18. A sacrificial layer 318 is formed over the substrate 101. More particularly, the sacrificial layer 318 is flowable and fills the trenches 102 between the neighboring fins 103 shown in FIG. 17 and over a top of the fins 103. The sacrificial layer 318 is made of a solvent 320 and a polymeric material 322 dissolved in the solvent 320. The solvent 320 of the sacrificial layer 318 is advantageous to increase a fluidity and a thickness of the sacrificial layer 318 in order to improve a flatness in the top surface of the sacrificial layer 318. Therefore, the sacrificial layer 318 may exhibit a high degree of flatness in its top surface. The sacrificial layer 318 is similar to the sacrificial layer 18 (see, for example, FIGS. 1-14) in terms of composition and formation, and the description thereof is not repeated herein.

Figure 19:
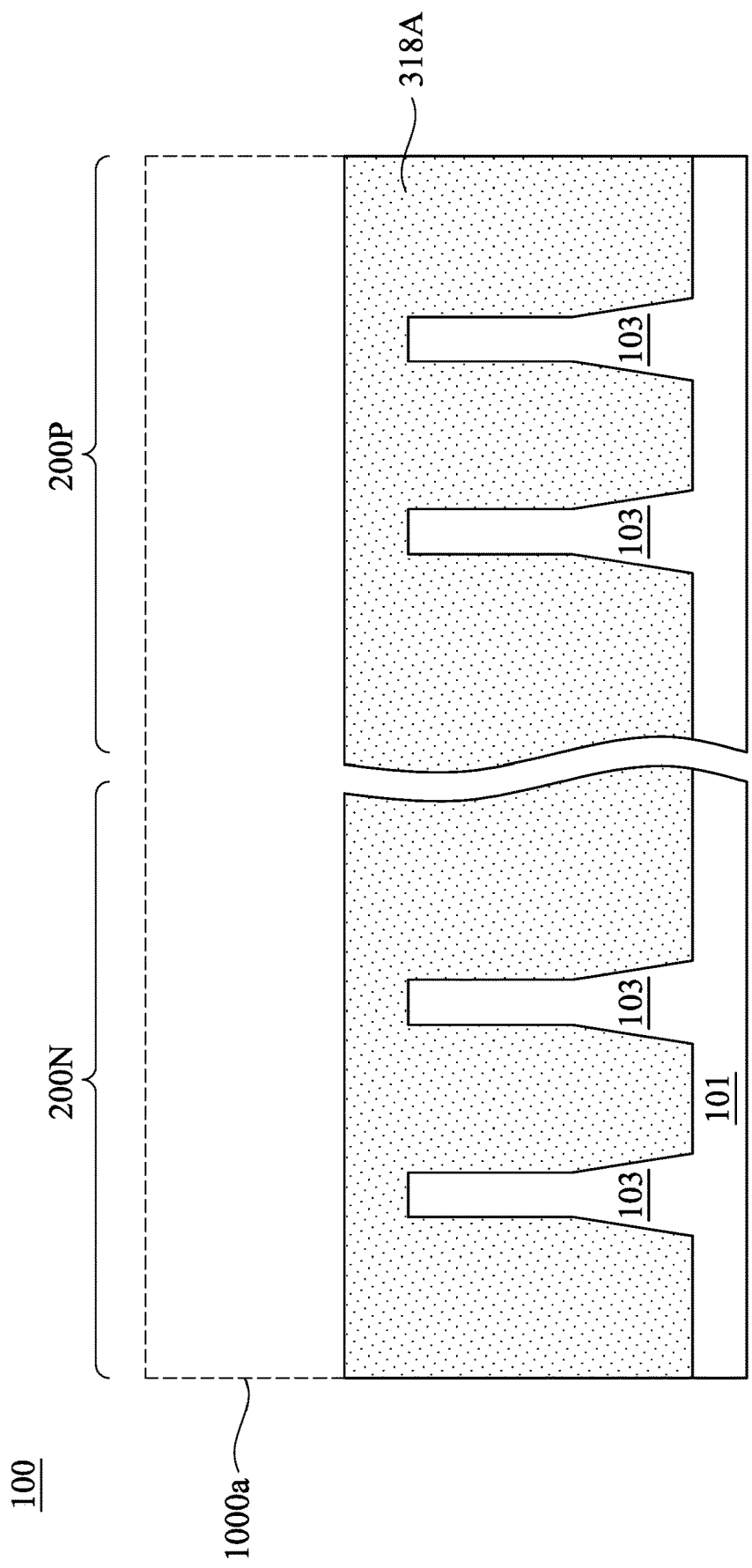

Reference is made to FIG. 19. A backing process is performed to reflow the sacrificial layer 318 to form a sacrificial layer 318A. By performing the baking process, the solvent 320 (see FIG. 18) is evaporated. An amount of the evaporated solvent 320 is illustrated by a dashed line 1000a. As a result, the sacrificial layer 318A has a reduced thickness. Details of the baking process are similar to the baking process as discussed previously with regard to FIG. 3.

Figure 20:
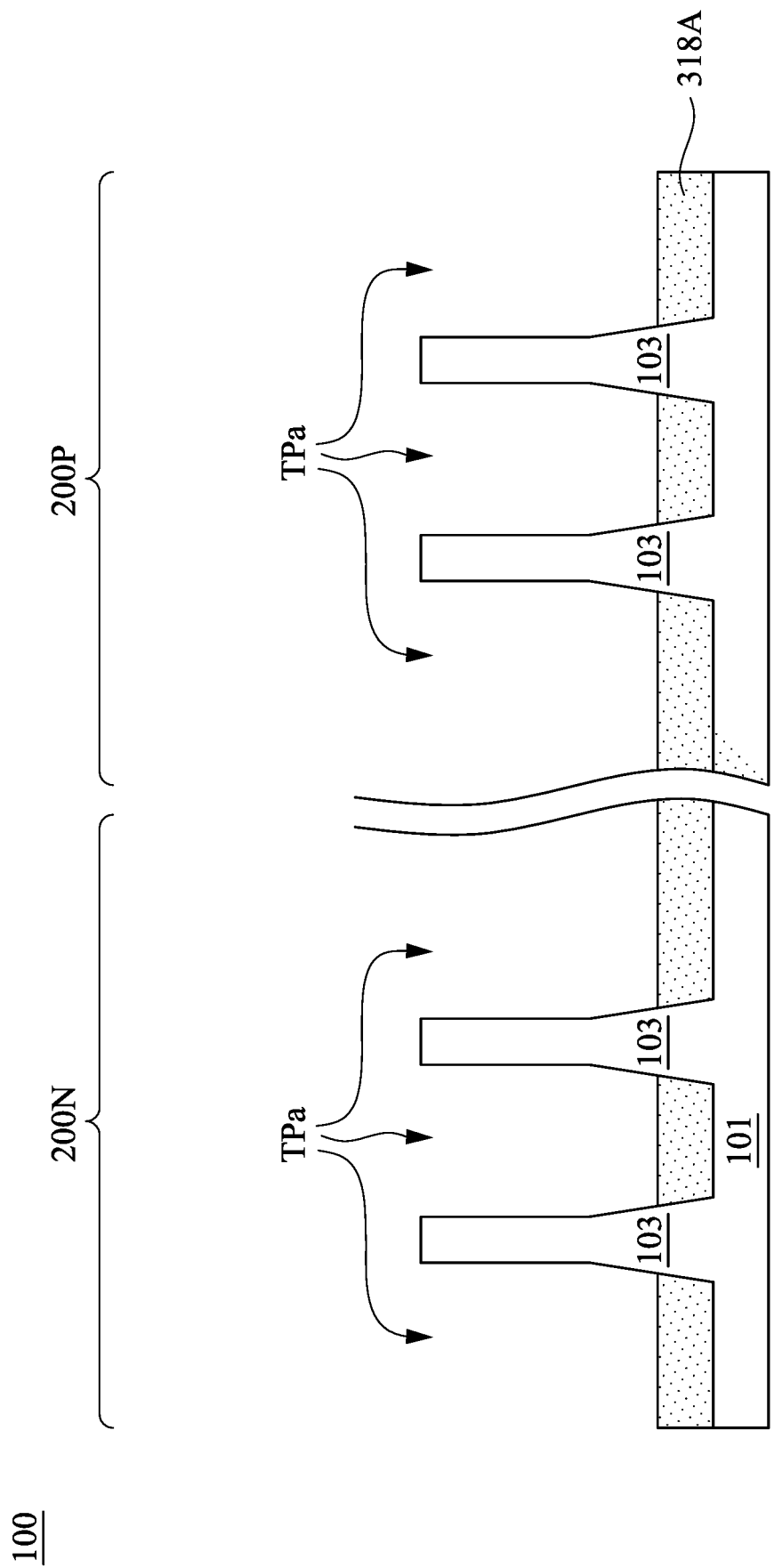

The sacrificial layer 318A is then etched back, as shown in FIG. 20. Due to the improvement of flatness in the top surface of the sacrificial layer 318A, the etched back sacrificial layer 318A has a high degree of flatness as well. Since subsequently formed air gaps 126 (see FIG. 24) has a height substantially equal to a thickness of the etched back sacrificial layer 318A, by controlling an etch amount of the sacrificial layer 318A, the air gaps with a desired height can be obtained. For example, by etching a greater amount of the sacrificial layer 318A, the air gaps 126 (see FIG. 24) may have reduced height. After etching back the sacrificial layer 318A, the fins 103 are exposed from the sacrificial layer 318A. The neighboring fins 103 may be separated by a top spacing TPa laterally.

Figure 21:
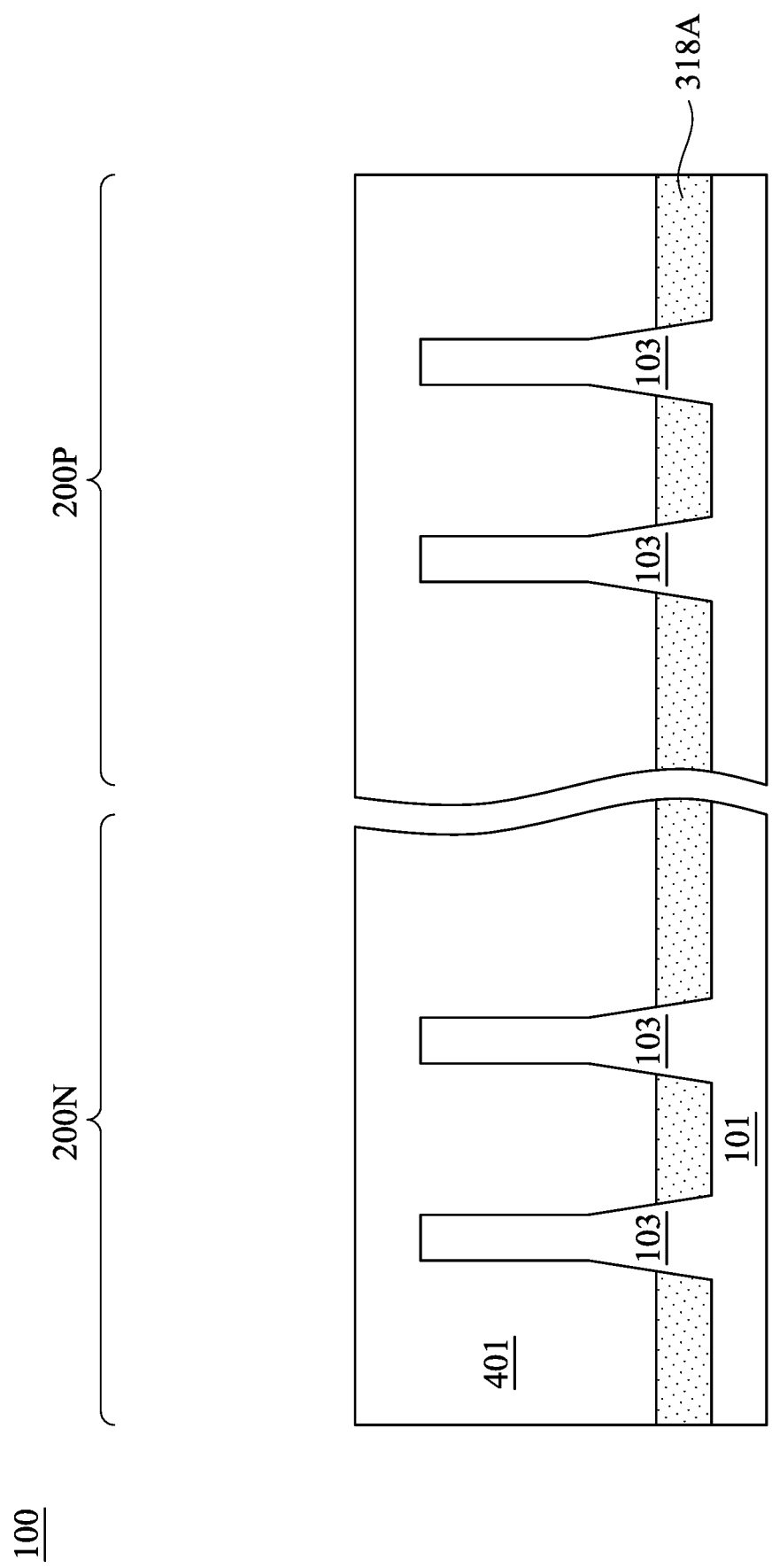

In FIG. 21, an insulation material 401 is formed over the sacrificial layer 318A and filling into the top spacing TPa between neighboring fins 103. Due to the sacrificial layer 318A having a high degree of flatness, the dielectric layer 401 has a bottom surface with a high degree of flatness as well. The insulation material 401 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 401 is silicon oxide formed by a FCVD process. An anneal process may be performed once the insulation material is formed. In an embodiment, the insulation material 401 is formed such that excess material of the insulation material 401 covers the fins 103. Although the insulation material 401 is illustrated as a single layer, some embodiments may utilize multiple layers. For example, in some embodiments a liner (not shown) may first be formed along a surface of the sacrificial layer 318A and the fins 103. Thereafter, a fill material, such as those discussed above may be formed over the liner.

Figure 22:
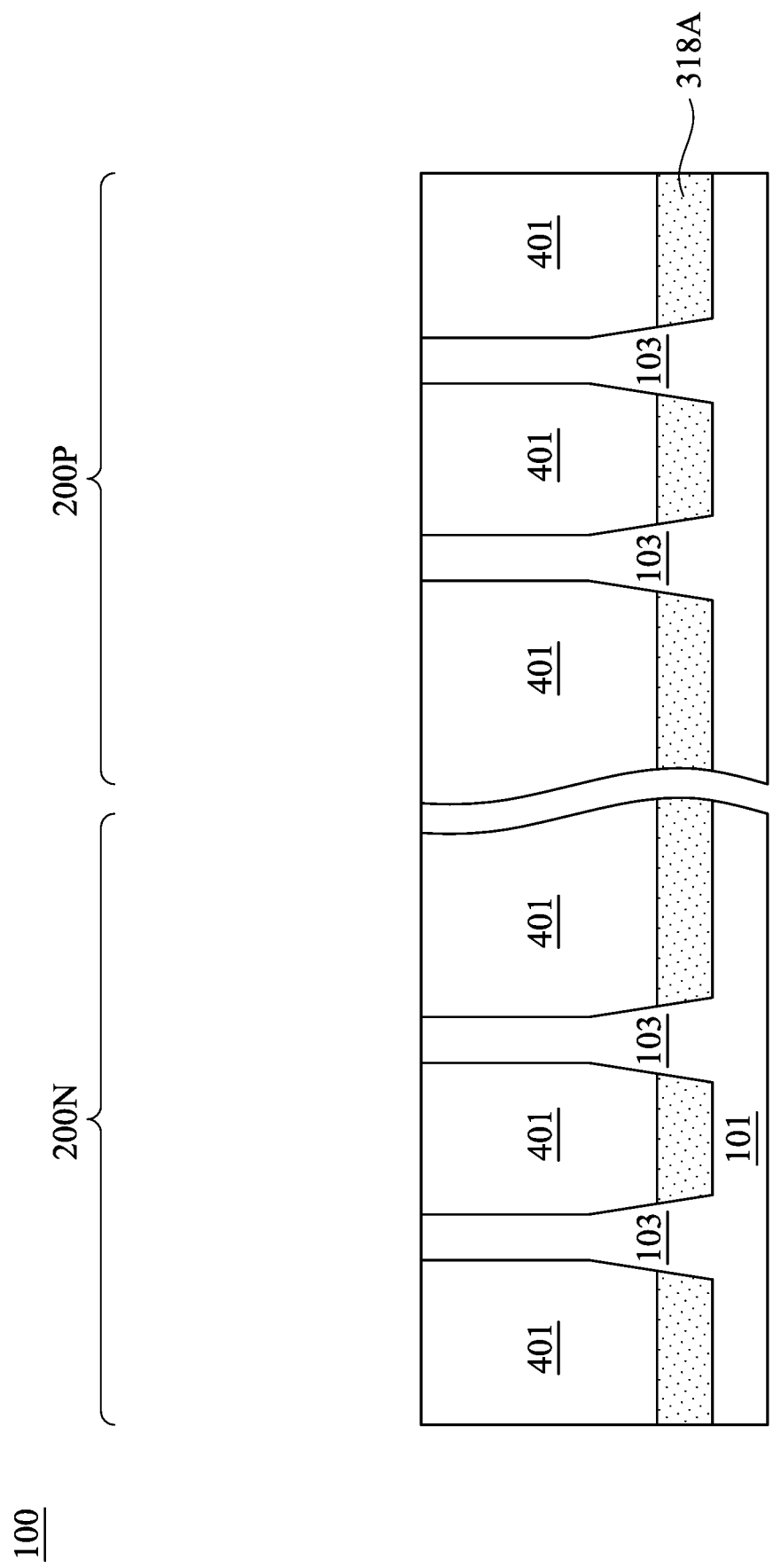

In FIG. 22, a removal process is applied to the insulation material 401 to remove the excess material of the insulation material 401 over the fins 103. In some embodiments, a planarization process such as a chemical mechanical polish (CMP), an etch-back process, combinations thereof, or the like may be utilized. The planarization process exposes the fins 103 such that top surfaces of the fins 103 and the insulation material 401 are level after the planarization process is complete. In embodiments in which a mask remains on the fins 103, the planarization process may expose the mask or remove the mask such that top surfaces of the mask or the fins 103, respectively, and the insulation material 401 are level after the planarization process is complete.

Figure 23:
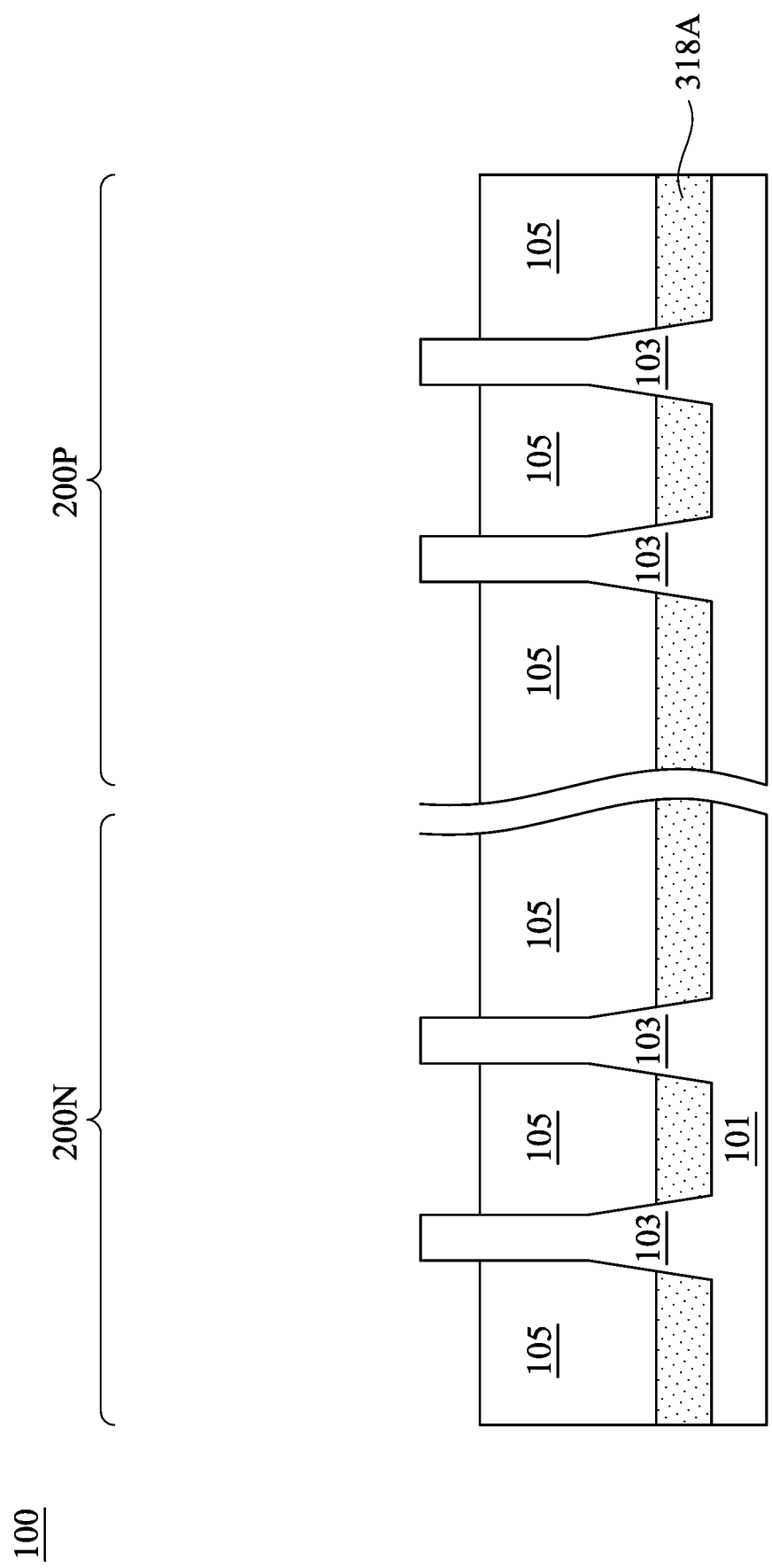

In FIG. 23, the insulation material 401 is recessed to form the STI regions 105. The insulation material 401 is recessed such that upper portions of fins 103 in the n-type region 200N and in the p-type region 200P protrude from between neighboring STI regions 105. Further, the top surfaces of the STI regions 105 may have a flat surface as illustrated, a convex surface, a concave surface (such as dishing), or a combination thereof. The top surfaces of the STI regions 105 may be formed flat, convex, and/or concave by an appropriate etch. The STI regions 105 may be recessed using an acceptable etching process, such as one that is selective to the material of the insulation material 401 (e.g., etches the material of the insulation material 401 at a faster rate than the material of the fins 103). For example, an oxide removal using, for example, dilute hydrofluoric (dHF) acid may be used.

Figure 24:
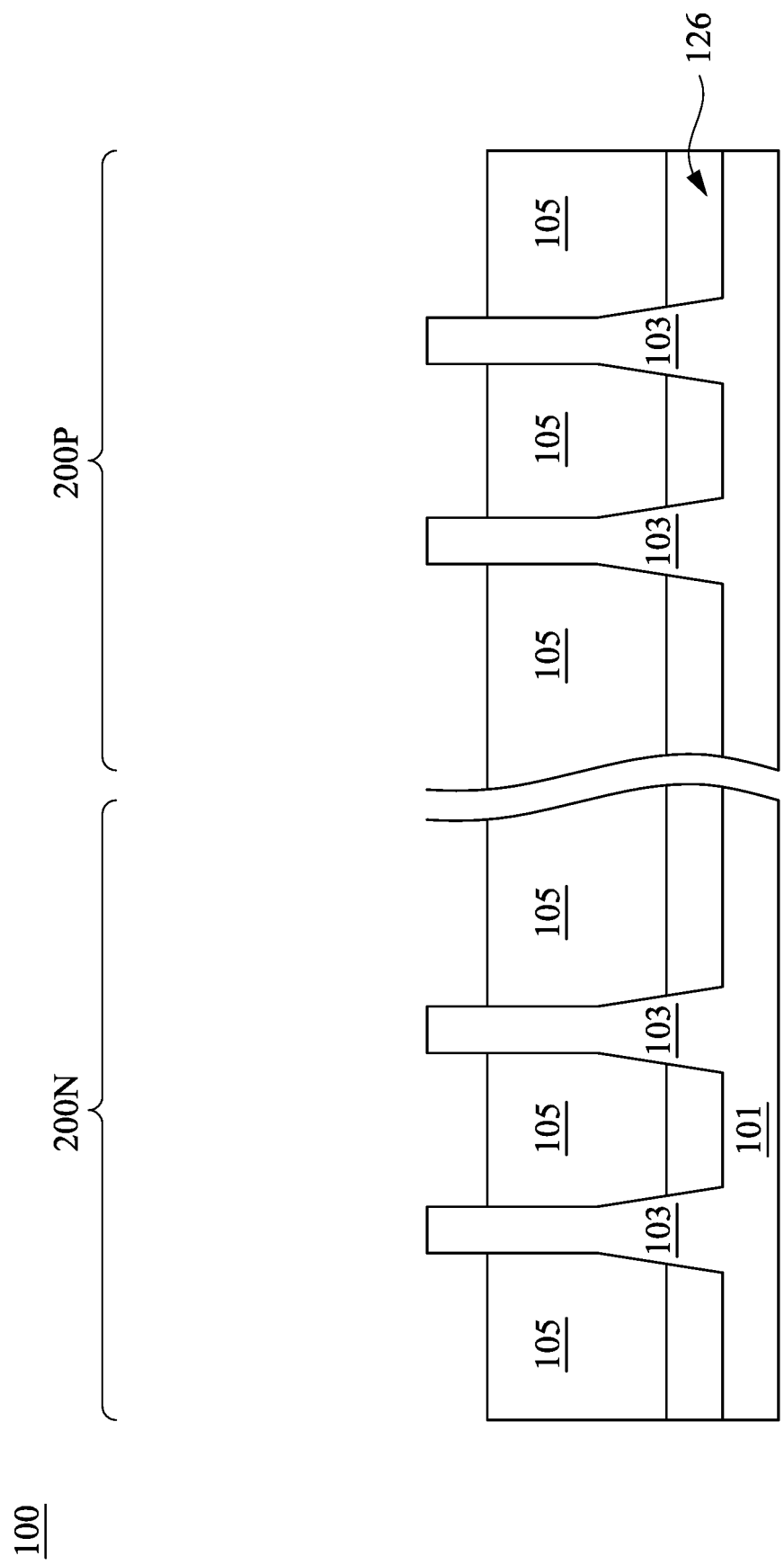

Reference is made to FIG. 24. The sacrificial layer 318A is then removed to form air gaps 126 between the STI regions 105 and the substrate 101. Details of removing the sacrificial layer 318A is similar to removing the sacrificial layer 18A as discussed previously with regard to FIG. 6. By forming the air gaps 126 with a uniform height, the capacitance coupling between fins 103 can be reduced so as to improve the overall performance characteristics of the Fin-FET 100.

Figure 25:
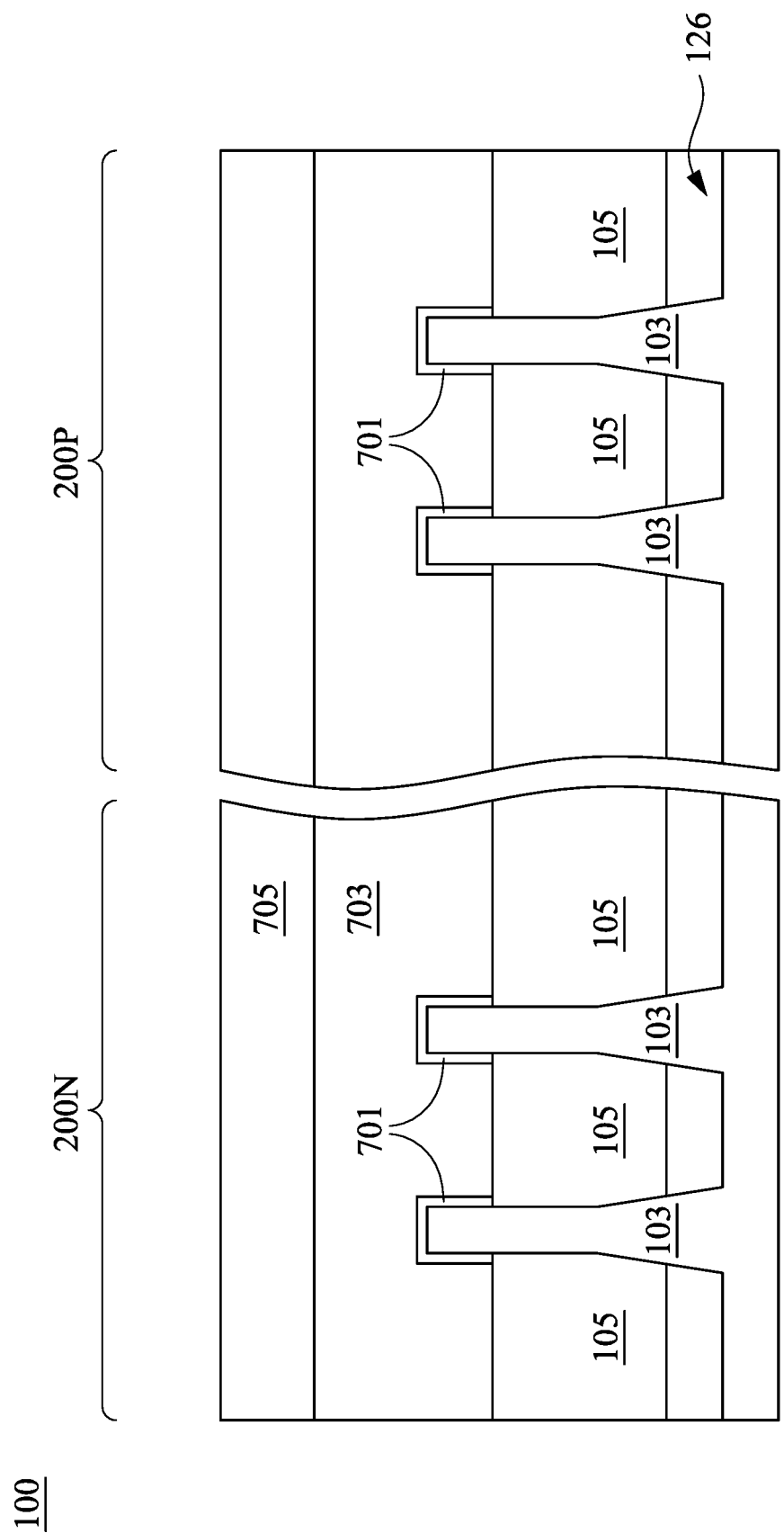

In FIG. 25, a dummy dielectric layer 701 is formed on the fins 103. The dummy dielectric layer 701 may be, for example, silicon oxide, silicon nitride, a combination thereof, or the like, and may be deposited or thermally grown according to acceptable techniques. The dummy dielectric layer 701 may be referred to herein as a dummy gate dielectric layer, a dummy gate dielectric, a dummy dielectric layer, or a dummy dielectric. A dummy gate layer 703 is formed over the dummy dielectric layer 701, and a mask layer 705 is formed over the dummy gate layer 703. The dummy gate layer 703 may be deposited over the dummy dielectric layer 701 and then planarized, such as by a CMP. The mask layer 705 may be deposited over the dummy gate layer 703. The dummy gate layer 703 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 703 may be deposited by physical vapor deposition (PVD), CVD, sputter deposition, or other techniques for depositing the selected material. The dummy gate layer 703 may be made of other materials that have a high etching selectivity from the etching of isolation regions, e.g., the STI regions 105 and/or the dummy dielectric layer 701. The mask layer 705 may include one or more layers of, for example, silicon nitride, silicon oxynitride, or the like. In this example, a single dummy gate layer 703 and a single mask layer 705 are formed across the n-type region 200N and the p-type region 200P. It is noted that the dummy dielectric layer 701 is shown covering only the fins 103 for illustrative purposes only. In some embodiments, the dummy dielectric layer 701 may be deposited such that the dummy dielectric layer 701 covers the STI regions 105, extending over the STI regions 105 and between the dummy gate layer 703 and the STI regions 105.

Figure 26B:
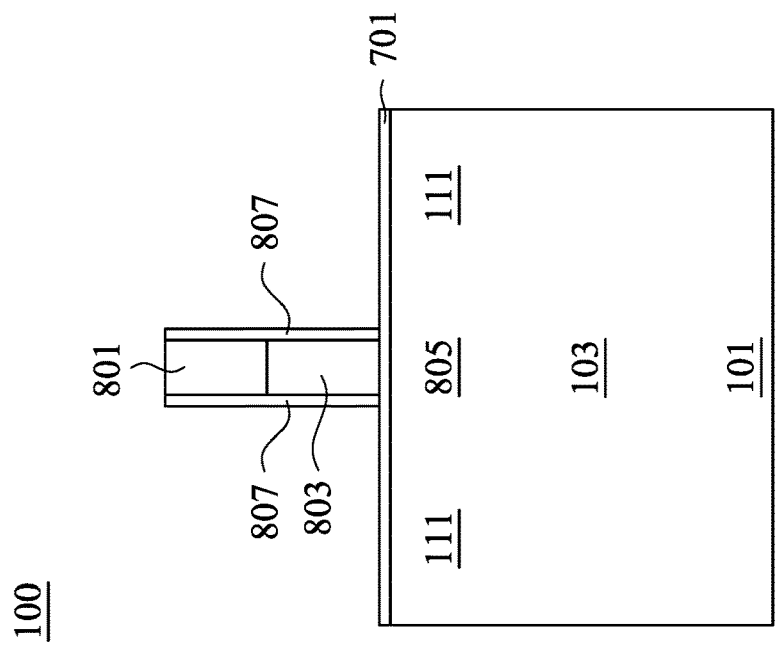
Figure 26A:
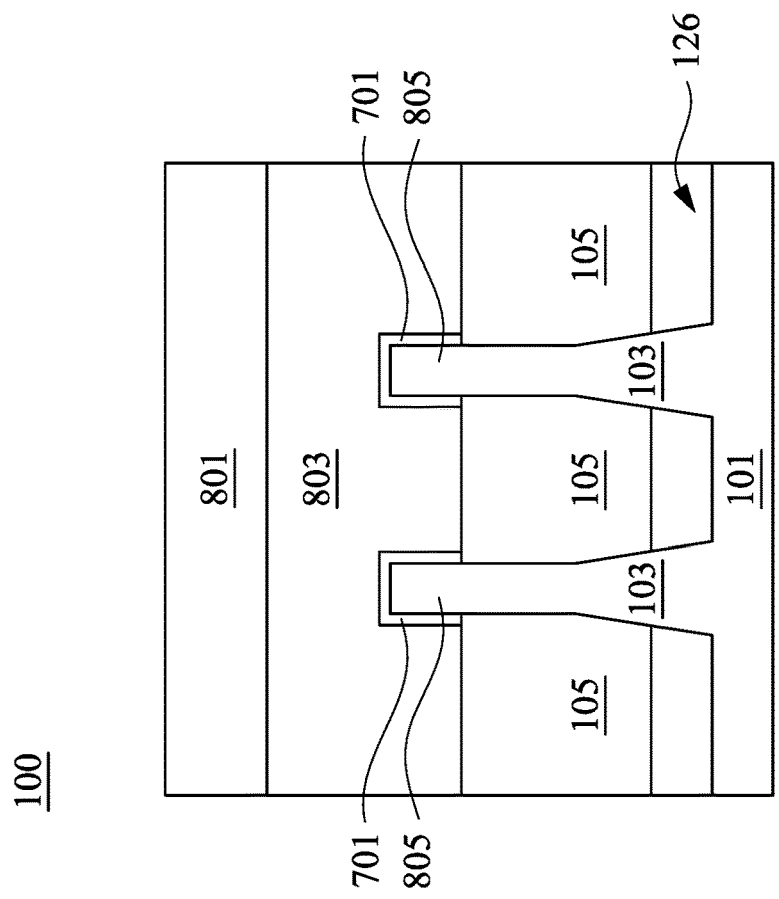

FIGS. 26A to 32B illustrate various additional steps in the manufacturing of embodiment devices. FIGS. 26A to 32B illustrate features in either of the n-type region 200N and the p-type region 200P. For example, the structures illustrated in FIGS. 26A to 32B may be applicable to both the n-type region 200N and the p-type region 200P. In FIGS. 26A and 26B, the mask layer 705 (see FIG. 25) may be patterned using acceptable photolithography and etching techniques to form masks 801. The pattern of the masks 801 then may be transferred to the dummy gate layer 703. In some embodiments (not illustrated), the pattern of the masks 801 may also be transferred to the dummy dielectric layer 701 by an acceptable etching technique to form dummy gates 803. The dummy gates 803 cover respective ones of the channel regions 805 of the fins 103. The pattern of the masks 801 may be used to physically separate each of the dummy gates 803 from adjacent dummy gates. The dummy gates 803 may also have a lengthwise direction substantially perpendicular to the lengthwise direction of respective ones of the fins 103.

Further in FIGS. 26A and 26B, gate seal spacers 807 can be formed on exposed surfaces of the dummy gates 803, the masks 801, and/or the fins 103. A thermal oxidation or a deposition followed by an anisotropic etch may form the gate seal spacers 807. The gate seal spacers 807 may be formed of silicon oxide, silicon nitride, silicon oxynitride, or the like.

After the formation of the gate seal spacers 807, implants for lightly doped source/drain (LDD) regions (not explicitly illustrated) may be performed. In the embodiments with different device types, a mask, such as a photoresist, may be formed over the n-type region 200N, while exposing the p-type region 200P, and appropriate type (e.g., p-type) impurities may be implanted into the exposed fins 103 in the p-type region 200P. The mask may then be removed. Subsequently, a mask, such as a photoresist, may be formed over the p-type region 200P while exposing the n-type region 200N, and appropriate type impurities (e.g., n-type) may be implanted into the exposed fins 103 in the n-type region 200N. The mask may then be removed. The n-type impurities may be the any of the n-type impurities previously discussed, and the p-type impurities may be the any of the p-type impurities previously discussed. An anneal process may be used to repair implant damage and to activate the implanted impurities.

Figure 27B:
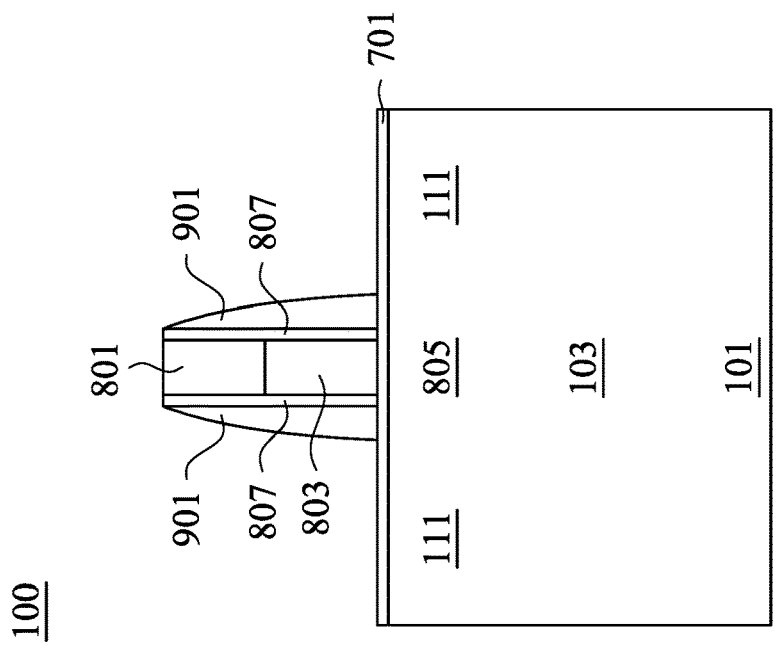
Figure 27A:
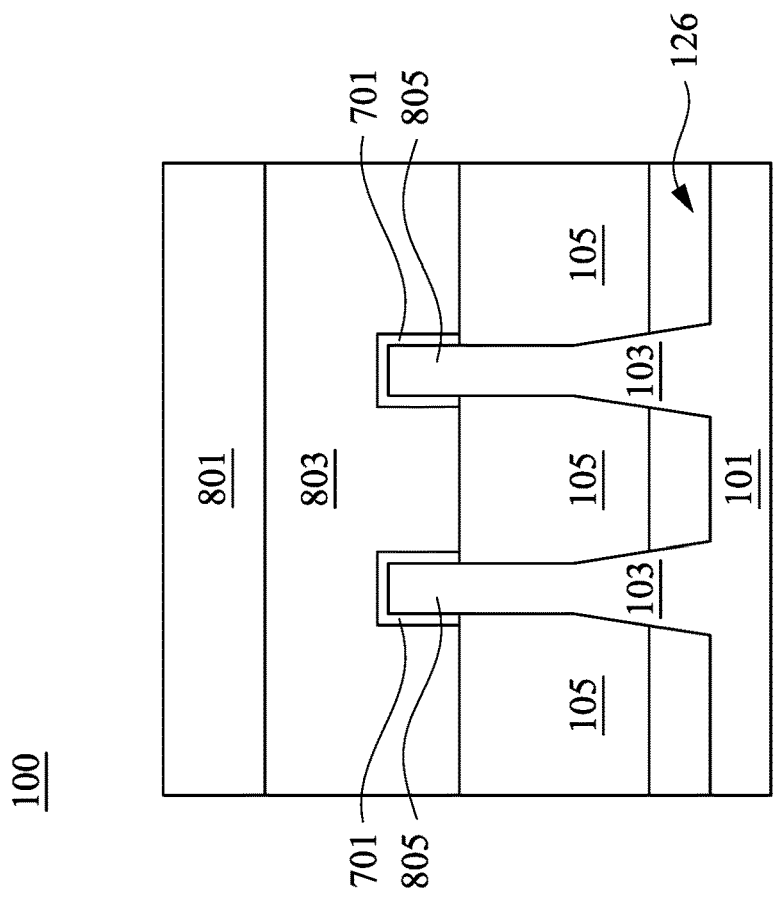

In FIGS. 27A and 27B, gate spacers 901 are formed on the gate seal spacers 807 along sidewalls of the dummy gates 803 and the masks 801. The gate spacers 901 may be formed by conformally depositing an insulating material and subsequently anisotropically etching the insulating material. The insulating material of the gate spacers 901 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers is omitted).

Figure 28B:
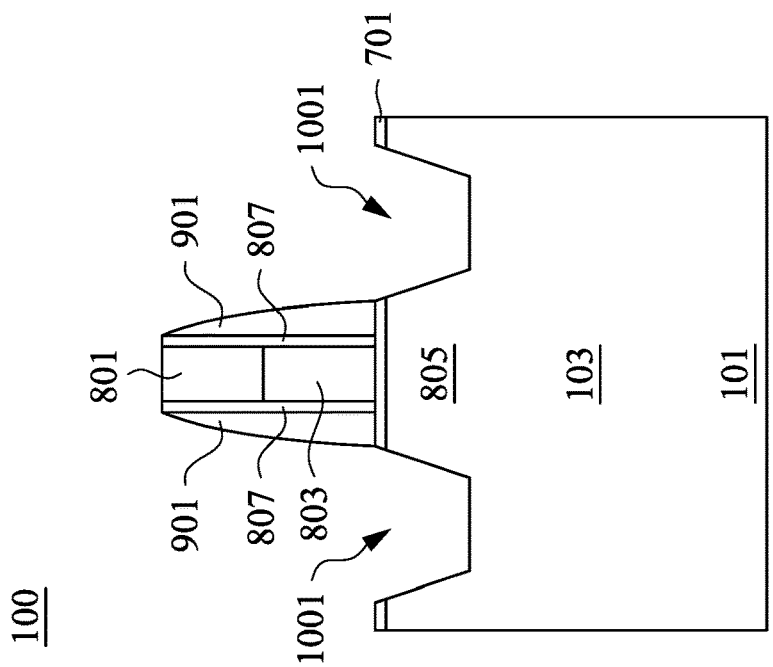
Figure 28A:
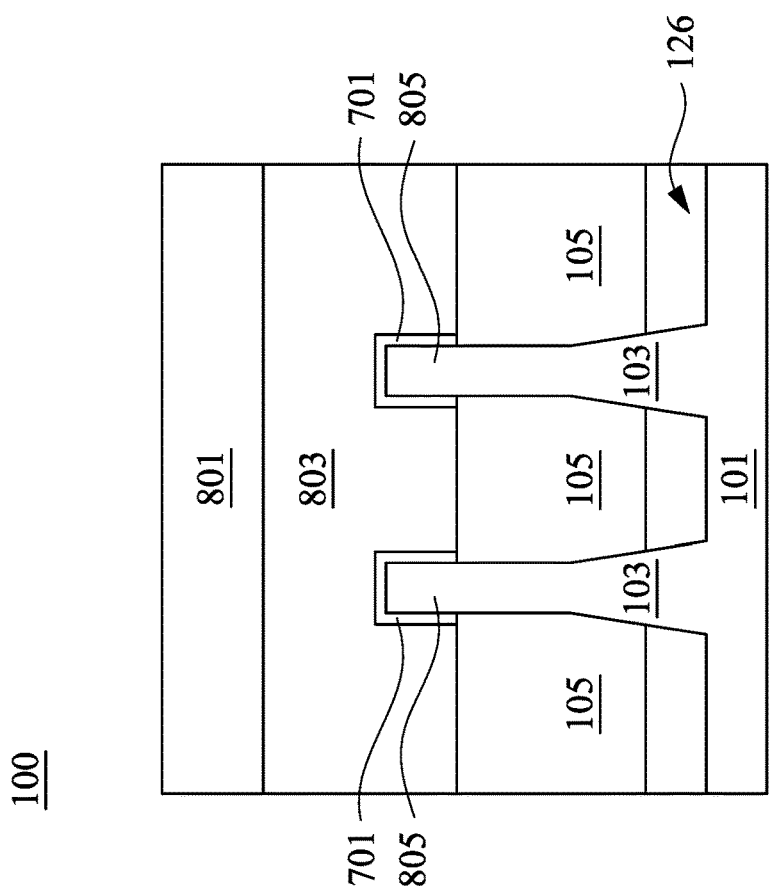

FIGS. 28A-28B illustrate a patterning process to form first openings 1001 in the source/drain regions 111 of the fins 103. The patterning process, according to some embodiments, comprises applying one or more masks and a photoresist over the substrate and then developing and etching the photoresist to form a mask over the intermediate structures illustrated in FIGS. 27A and 27B. Once formed, the mask is then used during an etching process to transfer the pattern of the mask into the underlying layers and form the first openings 1001 in the source/drain regions 111 of the fins 103. In the illustrated embodiment, the first openings 1001 are formed through the dummy dielectric layer 701 and into the materials of the fins 103 using an anisotropic etching process. The etching process may be a wet etch, a dry etch, combinations, or the like and may be performed using any suitable anisotropic etching process, isotropic etching process, combinations, or the like. Furthermore, the first openings 1001 may be formed to any suitable size and shape for forming such openings.

FIG. 28B further illustrates, with respect to the cutline along reference cross-section B-B illustrated in FIG. 15, the first openings 1001 being formed such that each dummy gate 803 is disposed between respective neighboring pairs of the first openings 1001. FIG. 28B also illustrates that the first openings 1001 are formed through the dummy dielectric layer 701 and into the materials of the fins 103 with an anisotropic etch, according to some embodiments.

Figure 29B:
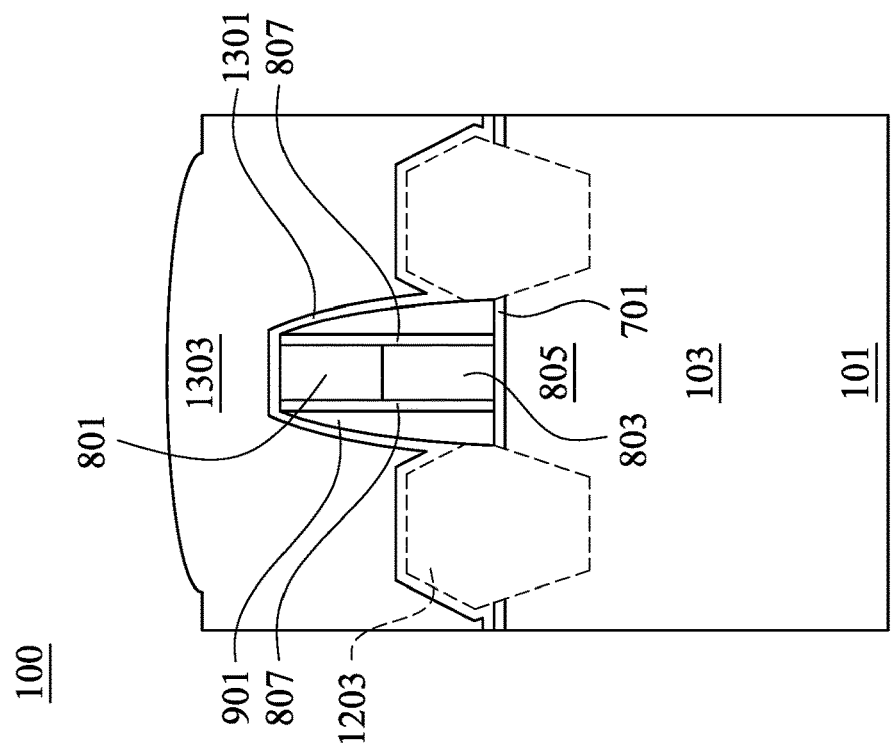
Figure 29A:
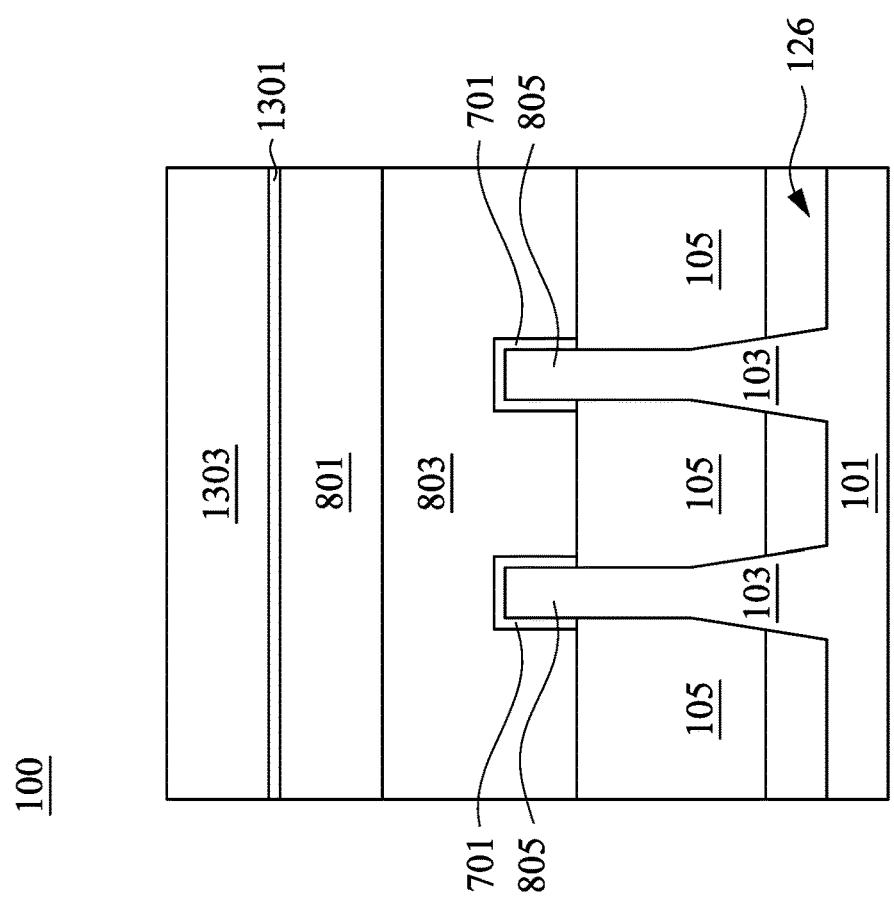

Referring to FIGS. 29A and 29B, epitaxial source/drain regions 1203 are formed in the first openings 1001. In accordance with some embodiments, the epitaxial source/drain regions 1203 may exert stress on the fins 103, which are used as the channels of the corresponding transistors, thereby improving performance. Depending on whether the resulting transistor is a p-type transistor or an n-type transistor, a p-type or an n-type impurity may be in-situ doped with the proceeding of the epitaxy. For example, when the resulting transistor is a p-type Transistor, silicon germanium boron (SiGeB), silicon boron (SiB), or the like may be grown. Conversely, when the resulting transistor is an n-type Transistor, silicon phosphorous (SiP), silicon carbon phosphorous (SiCP), or the like may be grown.

After the epitaxy process, the epitaxial source/drain regions 1203 may be further implanted with a p-type or an n-type impurity to form source and drain regions, which are also denoted using reference numeral 1203. In accordance with alternative embodiments of the present disclosure, the implantation process is skipped when epitaxial source/drain regions 1203 are in-situ doped with the p-type or n-type impurity during the epitaxy, and the epitaxial source/drain regions 1203 are also source/drain regions.

Once the epitaxial source/drain regions 1203 have been formed in the first openings 1001, a contact etch stop layer 1301 and a first interlayer dielectric 1303 may be formed. In some embodiments, the contact etch stop layer 1301 is formed over exposed surfaces of the epitaxial source/drain regions 1201, the dummy dielectric layer 701, the gate spacers 901, the gate seal spacers 807, and the masks 801. The contact etch stop layer 1301 may comprise a dielectric material, such as, silicon nitride, silicon oxide, silicon oxynitride, or the like. However, any suitable dielectric material may be used.

Once the contact etch stop layer 1301 has been formed, the first interlayer dielectric 1303 is deposited over the contact etch stop layer 1301. The first interlayer dielectric 1303 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may also be used. According to some embodiments, the dielectric material of the contact etch stop layer 1301 has a lower etch rate than the dielectric material of the first interlayer dielectric 1303.

Figure 30B:
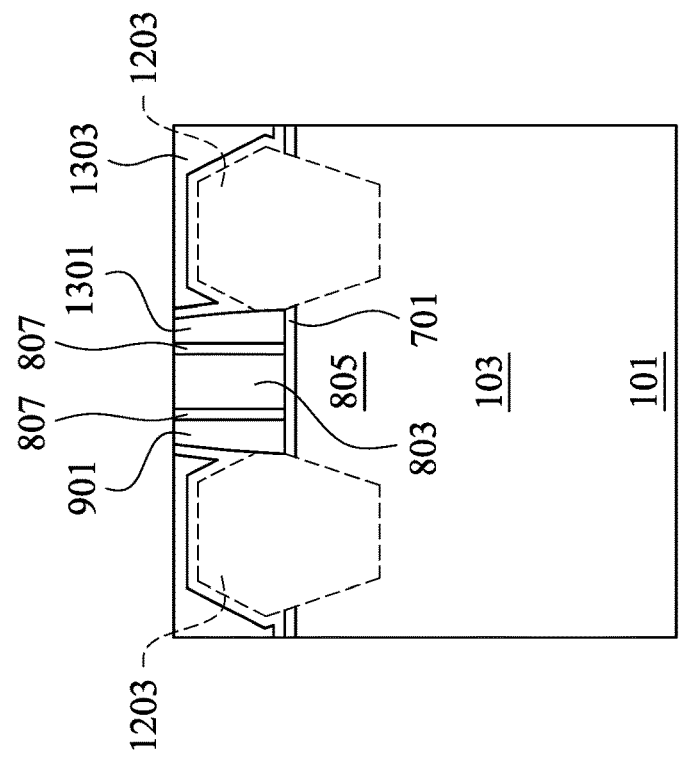
Figure 30A:
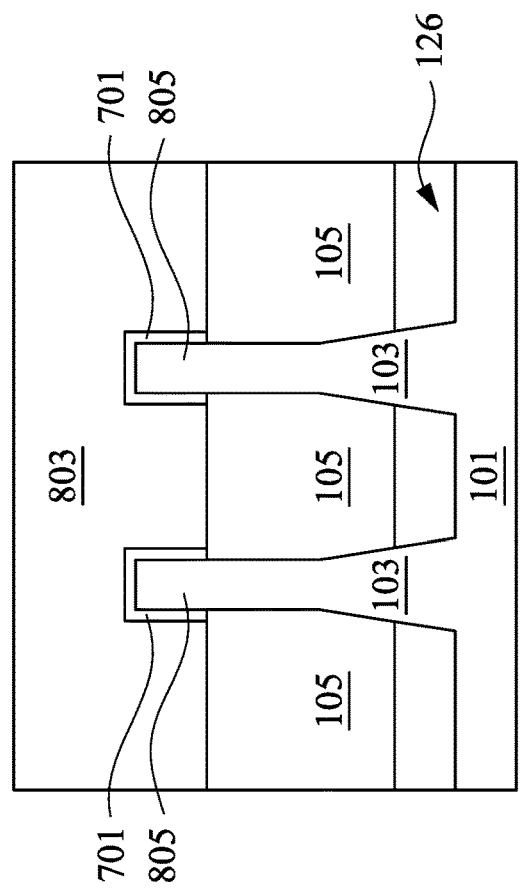

A planarization process, such as a CMP, may be performed to level the top surface of the first interlayer dielectric 1303 with the top surfaces of the dummy gates 803 or the masks 801. The planarization process may also remove the masks 801 on the dummy gates 803, and portions of the gate seal spacers 807 and the gate spacers 901 along sidewalls of the masks 801. The resulting structure is shown in FIGS. 30A and 30B. After the planarization process, top surfaces of the dummy gates 803, the gate seal spacers 807, the gate spacers 901, and the first interlayer dielectric 1303 are level. Accordingly, the top surfaces of the dummy gates 803 are exposed through the first interlayer dielectric 1303. In some embodiments, the masks 801 may remain, in which case the planarization process levels the top surface of the first interlayer dielectric 1303 with the top surfaces of the masks 801.

Figure 31B:
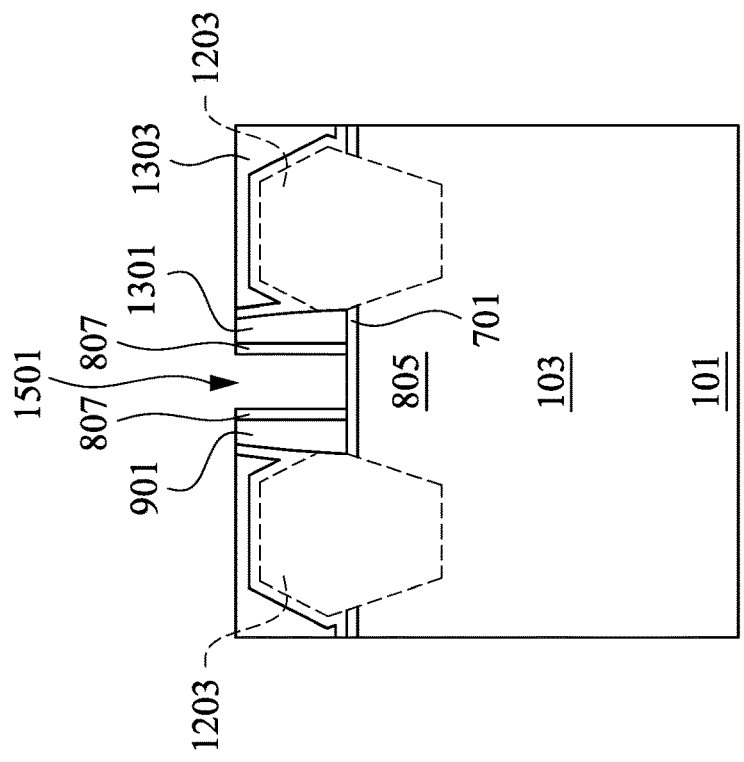
Figure 31A:
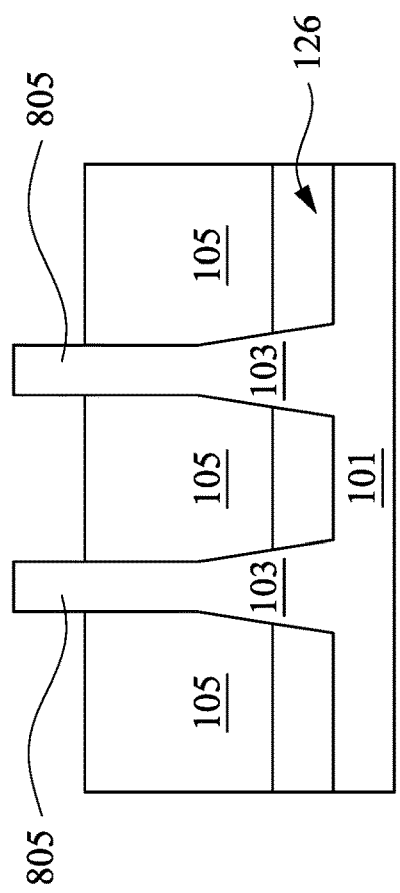

In FIGS. 31A and 31B, the dummy gates 803, and the masks 801 if present, are removed in an etching step(s), so that second openings 1501 are formed. Portions of the dummy dielectric layer 701 in the second openings 1501 may also be removed. In some embodiments, only the dummy gates 803 are removed and the dummy dielectric layer 701 remains and is exposed by the second openings 1501. In some embodiments, the dummy dielectric layer 701 is removed from second openings 1501 in a first region of a die (e.g., a core logic region) and remains in second openings 1501 in a second region of the die (e.g., an input/output region). In some embodiments, the dummy gates 803 are removed by an anisotropic dry etch process. For example, the etching process may include a dry etch process using reaction gas(es) that selectively etch the dummy gates 803 with little or no etching of the first interlayer dielectric 1303 or the gate spacers 901. Each of the second openings 1501 exposes and/or overlies a channel region 805 of a respective one of the fins 103. Each channel region 805 is disposed between neighboring pairs of the epitaxial source/drain regions 1203. During the removal, the dummy dielectric layer 701 may be used as an etch stop layer when the dummy gates 803 are etched. The dummy dielectric layer 701 may then be optionally removed after the removal of the dummy gates 803.

Figure 32B:
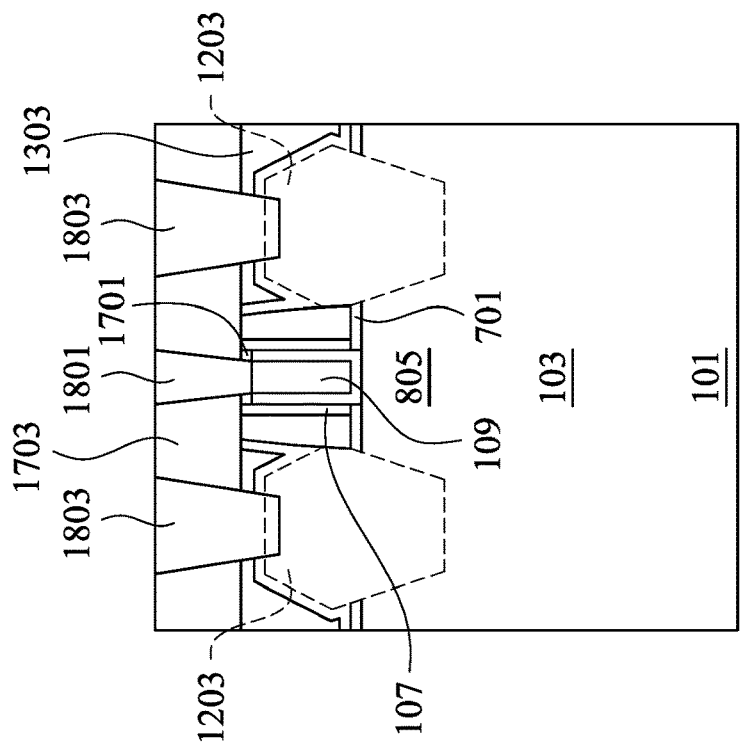
Figure 32A:
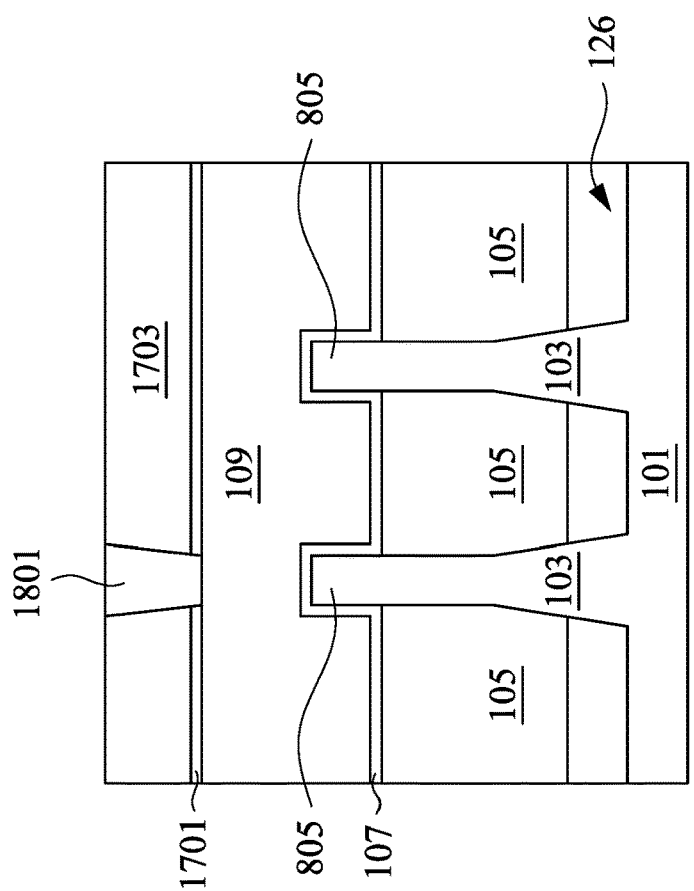

In FIGS. 32A and 32B, the gate dielectric layers 107 and the gate electrodes 109 are formed for replacement gates. Gate dielectric layers 107 may be formed by one or more layers deposited in the second openings 1501, such as on the top surfaces and the sidewalls of the fins 103 and on sidewalls of the gate seal spacers 807 and/or gate spacers 901. The gate dielectric layers 107 may also be formed on the top surface of the first interlayer dielectric 1303. In some embodiments, the gate dielectric layers 107 comprise one or more dielectric layers, such as one or more layers of silicon oxide, silicon nitride, metal oxide, metal silicate, or the like. For example, in some embodiments, the gate dielectric layers 107 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 107 may include a dielectric layer having a k value greater than about 7.0. The formation methods of the gate dielectric layers 107 may include Molecular-Beam Deposition (MBD), atomic layer deposition (ALD), PECVD, and the like. In embodiments where portions of the dummy dielectric layer 701 remains in the second openings 1501, the gate dielectric layers 107 include a material of the dummy dielectric layer 701 (e.g., $SiO_2$).

The gate electrodes 109 are deposited over the gate dielectric layers 107, respectively, and fill the remaining portions of the second openings 1501. The gate electrodes 109 may include a metal-containing material such as titanium nitride, titanium oxide, tantalum nitride, tantalum carbide, cobalt, ruthenium, aluminum, tungsten, combinations thereof, or multi-layers thereof. For example, although a single layer is illustrated for the gate electrode 109 in FIG. 32B, the gate electrode 109 may comprise any number of liner layers, any number of work function tuning layers, and a fill material. After the filling and/or overfilling of the second openings 1501, a planarization process, such as a CMP, may be performed to remove the excess portions of the gate dielectric layers 107 and the material of the gate electrodes 109 from top surface of the first interlayer dielectric 1303. The remaining portions of material of the gate electrodes 109 and the gate dielectric layers 107 thus form replacement gates of the resulting FinFETs. The gate electrodes 109 and the gate dielectric layers 107 may be collectively referred to as a "gate stack." The gate and the gate stacks may extend along sidewalls of the channel region 805 of the fins 103.

The formation of the gate dielectric layers 107 in the n-type region 200N and the p-type region 200P may occur simultaneously such that the gate dielectric layers 107 in each region are formed from the same materials, and the formation of the gate electrodes 109 may occur simultaneously such that the gate electrodes 109 in each region are formed from the same materials. In some embodiments, the gate dielectric layers 107 in each region may be formed by distinct processes, such that the gate dielectric layers 107 may be different materials, and/or the gate electrodes 109 in each region may be formed by distinct processes, such that the gate electrodes 109 may be different materials. Various masking steps may be used to mask and expose appropriate regions when using distinct processes.

A gate mask 1701 is formed over the gate stack (including a gate dielectric layer 107 and a gate electrode 109), and the gate mask 1701 may be disposed between opposing portions of the gate spacers 901. In some embodiments, forming the gate mask 1701 includes recessing the gate stack so that a recess is formed directly over the gate stack and between opposing portions of the gate spacers 901. A gate mask 1701 comprising one or more layers of dielectric material, such as silicon nitride, silicon oxynitride, or the like, is filled and/or overfilled in the recess, followed by a planarization process to remove excess portions of the dielectric material extending over the first interlayer dielectric 1303.

A second interlayer dielectric 1703 is deposited over the first interlayer dielectric 1303. In some embodiments, the second interlayer dielectric 1703 is a flowable film formed by a flowable CVD method. In some embodiments, the second interlayer dielectric 1703 is formed of a dielectric material such as PSG, BSG, BPSG, USG, or the like, and may be deposited by any suitable method, such as CVD and PECVD. The subsequently formed gate contacts 1801 penetrate through the second interlayer dielectric 1703 and the gate mask 1701 to contact the top surface of the recessed gate electrode 109. The gate contacts 1801 and the source/drain contacts 1803 are formed by initially forming openings through one or more of the second interlayer dielectric 1703, the first interlayer dielectric 1303, the contact etch stop layer 1301, or the gate mask 1701.

In particular, openings for the source/drain contacts 1803 are formed through the second interlayer dielectric 1703, the first interlayer dielectric 1303, the contact etch stop layer 1301 and into the epitaxial source/drain regions 1203. The openings for the source/drain contacts 1803 may be formed using acceptable photolithography and etching techniques.

Furthermore, openings for the gate contacts 1801 may be formed in combination with or in addition to the openings for the source/drain contacts 1803. The openings for the gate contacts 1801 are formed through the second interlayer dielectric 1703, the gate mask 1701, and into the materials of the gate electrode 109. The openings for the gate contacts 1801 may be formed using acceptable photolithography and etching techniques.

Once openings have been formed for the source/drain contacts 1803 and/or the gate contacts 1801, a liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second interlayer dielectric 1703. The remaining liner and conductive material form the source/drain contacts 1803 and/or the gate contacts 1801 in their respective openings. An anneal process may be performed to form a silicide at the interface between the epitaxial source/drain regions 1203 and the source/drain contacts 1803. The source/drain contacts 1803 are physically and electrically coupled to the epitaxial source/drain regions 1203, and the gate contacts 1801 are physically and electrically coupled to the gate electrodes 109 and provide external connections to the FinFET 100. The source/drain contacts 1803 and gate contacts 1801 may be formed in different processes, or may be formed in the same process. Although shown as being formed in the same cross-sections, it should be appreciated that each of the source/drain contacts 1803 and gate contacts 1801 may be formed in different cross-sections, which may avoid shorting of the contacts.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by including the solvent in the sacrificial layer, the fluidity and the thickness of the sacrificial layer is increased, leading to improvement of flatness in the top surface of the sacrificial layer. Another advantage is that the solvent has a boiling temperature high enough and thus would not evaporate during depositing the sacrificial layer.

In some embodiments, a method of forming a semiconductor device includes forming a plurality of non-insulator structures on a substrate, the plurality of non-insulator structures being spaced apart by trenches, forming a sacrificial layer overfilling the trenches, reflowing the sacrificial layer at an elevated temperature, wherein a top surface of the sacrificial layer after the reflowing is lower than a top surface of the sacrificial layer before the reflowing, etching back the sacrificial layer to lower the top surface of the sacrificial layer to fall below top surfaces of the plurality of non-insulator structures, forming a dielectric layer on the sacrificial layer, and removing the sacrificial layer to form air gaps below the dielectric layer. In some embodiments, reflowing the sacrificial layer is carried out at a temperature of 40° C. to 220° C. In some embodiments, the sacrificial layer includes a solvent and a polymeric material dissolved in the solvent. In some embodiments, the solvent has a boiling temperature in a range of about 180° C. to about 350° C. In some embodiments, during reflowing the sacrificial layer, the solvent is evaporated. In some embodiments, the polymeric material has a glass transition temperature lower than 200° C., a melting temperature lower than 300° C., and a decomposable temperature lower than 400° C.

In some embodiments, a method of forming a semiconductor device includes forming a plurality of non-insulator structures on a substrate, wherein the plurality of non-insulator structures are laterally separated from each other by trenches, filling the trenches by a sacrificial layer, wherein the sacrificial layer is flowable and includes a solvent, evaporating the solvent to reduce a thickness of the sacrificial layer, after evaporating the solvent, etching back the sacrificial layer such that the non-insulator structures protrude above the etched-back sacrificial layer, forming a dielectric layer on the non-insulator structures, and removing the sacrificial layer to form air gaps between the dielectric layer and the substrate. In some embodiments, the solvent is made of Tripropylene glycol monomethyl ether (TPM), 2-Phenoxyethanol, Heptyl ether, Dodecane or a combination thereof. In some embodiments, the sacrificial layer further includes a polymeric material, wherein the polymeric material is made of ester, carbamate, carbonate, acetal ester, or a combination thereof. In some embodiments, the sacrificial layer further includes a polymeric material, wherein the polymeric material is made of polyisoprene, poly(ethylene-co-glycidyl methacrylate), poly(methyl methacrylate), poly(ethylene oxide), poly(carbamate), poly(carbonate), poly(acetal ester), copolymer thereof or a hybrid thereof. In some embodiments, the sacrificial layer further includes a cross-linker, wherein the cross-linker is made of tetramethoxymethyl glycol urea (TMGU), epoxide, triazene, glycidyl ether, maleimide with acetal ester, epoxide with carbonate, epoxide with carbamate, epoxide with ester, or a combination thereof. In some embodiments, the sacrificial layer further includes a cross-linker, wherein the cross-linker is made of glycidyl ether, alkyl oxide, alkene, alkyne, triazene, or a combination thereof. In some embodiments, the air gaps have substantially equal heights. In some embodiments, removing the sacrificial layer is performed using thermal pyrolysis.

In some embodiments, a method of forming a semiconductor device includes forming non-insulator structures protruding on a semiconductor substrate, spin coating a sacrificial layer on the non-insulator structures, in which the sacrificial layer includes a solvent and a solute dissolved in the solvent and having a first thermal cleavable group, the solute including polymer, oligomer, co-polymer, oligomer/polymer hybrid, and/or a combination thereof, and a first cross-linker, performing a baking process to the sacrificial layer, etching back the sacrificial layer, depositing a dielectric layer on the sacrificial layer, and replacing the sacrificial layer with an air gap. In some embodiments, the baking process is performed prior to etching back the sacrificial layer. In some embodiments, the sacrificial layer further comprises a second cross-linker having a second thermal cleavable functional group embedded therein. In some embodiments, the first cross-linker and the second cross-linker have different compositions. In some embodiments, the first thermal cleavable group is on a main chain of the polymer, oligomer, co-polymer, oligomer/polymer hybrid, and/or a combination thereof. In some embodiments, the first thermal cleavable group is on a side chain of the polymer, oligomer, co-polymer, oligomer/polymer hybrid, and/or a combination thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a plurality of non-insulator structures on a substrate, the plurality of non-insulator structures being spaced apart by trenches;
    forming a sacrificial layer overfilling the trenches;
    reflowing the sacrificial layer at an elevated temperature, wherein a top surface of the sacrificial layer after the reflowing is lower than a top surface of the sacrificial layer before the reflowing, and a middle of a first segment of the top surface of the sacrificial layer between two of the plurality of non-insulator structures after the reflowing is at a same elevation as a second segment of the top surface of the sacrificial layer directly over one of the plurality of non-insulator structures after the reflowing;
    etching back the sacrificial layer to lower the top surface of the sacrificial layer to fall below top surfaces of the plurality of non-insulator structures;
    forming a dielectric layer on the sacrificial layer; and
    removing the sacrificial layer to form air gaps below the dielectric layer.

2. The method of claim 1, wherein reflowing the sacrificial layer is carried out at a temperature of 40° C. to 220° C.

3. The method of claim 1, wherein the sacrificial layer comprises:
    a solvent; and
    a polymeric material dissolved in the solvent.

4. The method of claim 3, wherein the solvent has a boiling temperature in a range of about 180°C to about 350° C.

5. The method of claim 3, wherein during reflowing the sacrificial layer, the solvent is evaporated.

6. The method of claim 3, wherein the polymeric material has a glass transition temperature lower than 200° C., a melting temperature lower than 300° C., and a decomposable temperature lower than 400° C.

7. A method of forming a semiconductor device, comprising:
    forming a plurality of non-insulator structures on a substrate, wherein the plurality of non-insulator structures are laterally separated from each other by trenches;
    filling the trenches by a sacrificial layer, wherein the sacrificial layer is flowable and includes a solvent;
    evaporating the solvent to reduce a thickness of the sacrificial layer, wherein evaporating the solvent is performed such that the sacrificial layer between two of the non-insulator structures has a middle with a first top surface at a same elevation as a second top surface of the sacrificial layer directly over the non-insulator structures;
    after evaporating the solvent, etching back the sacrificial layer such that the non-insulator structures protrude above the etched-back sacrificial layer;
    forming a dielectric layer on the non-insulator structures; and
    removing the sacrificial layer to form air gaps between the dielectric layer and the substrate.

8. The method of claim 7, wherein the solvent is made of Tripropylene glycol monomethyl ether (TPM), 2-Phenoxyethanol, Heptyl ether, Dodecane or a combination thereof.

9. The method of claim 7, wherein the sacrificial layer further includes a polymeric material, wherein the polymeric material is made of ester, carbamate, carbonate, acetal ester, or a combination thereof.

10. The method of claim 7, wherein the sacrificial layer further includes a polymeric material, wherein the polymeric material is made of polyisoprene, poly(ethylene-co-glycidyl methacrylate), poly(methyl methacrylate), poly(ethylene oxide), poly(carbamate), poly(carbonate), poly(acetal ester), copolymer thereof or a hybrid thereof.

11. The method of claim 7, wherein the sacrificial layer further includes a cross-linker, wherein the cross-linker is made of tetramethoxymethyl glycol urea (TMGU), epoxide, triazene, glycidyl ether, maleimide with acetal ester, epoxide with carbonate, epoxide with carbamate, epoxide with ester, or a combination thereof.

12. The method of claim 7, wherein the sacrificial layer further includes a cross-linker, wherein the cross-linker is made of glycidyl ether, alkyl oxide, alkene, alkyne, triazene, or a combination thereof.

13. The method of claim 7, wherein the air gaps have substantially equal heights.

14. The method of claim 7, wherein removing the sacrificial layer is performed using thermal pyrolysis.

15. A method of forming a semiconductor device, comprising:
    forming non-insulator structures protruding on a semiconductor substrate;
    spin coating a sacrificial layer on the non-insulator structures, wherein the sacrificial layer comprises:
    a solvent;
    a solute dissolved in the solvent and having a first thermal cleavable group, the solute comprising polymer, oligomer, co-polymer, oligomer/polymer hybrid, and/or a combination thereof, and
    a first cross-linker;
    performing a baking process to the sacrificial layer, wherein the baking process is performed such that the sacrificial layer between two of the non-insulator structures has a middle with a first top surface at a same elevation as a second top surface of the sacrificial layer directly over the non-insulator structures;
    etching back the sacrificial layer;
    depositing a dielectric layer on the sacrificial layer; and
    replacing the sacrificial layer with an air gap.

16. The method of claim 15, wherein the baking process is performed prior to etching back the sacrificial layer.

17. The method of claim 15, wherein the sacrificial layer further comprises a second cross-linker having a second thermal cleavable functional group embedded therein.

18. The method of claim 17, wherein the first cross-linker and the second cross-linker have different compositions.

19. The method of claim 15, wherein the first thermal cleavable group is on a main chain of the polymer, oligomer, co-polymer, oligomer/polymer hybrid, and/or a combination thereof.

20. The method of claim 15, wherein the first thermal cleavable group is on a side chain of the polymer, oligomer, co-polymer, oligomer/polymer hybrid, and/or a combination thereof.

* * * * *